(12) United States Patent
Amin et al.

(10) Patent No.: US 6,784,451 B2
(45) Date of Patent: Aug. 31, 2004

(54) MULTI-JUNCTION PHASE QUBIT

(75) Inventors: Mohammad H. S. Amin, Vancouver (CA); Alexandre Zagoskin, Vancouver (CA); Geordie Rose, Vancouver (CA); Jeremy P. Hilton, Vancouver (CA)

(73) Assignee: D-Wave Systems Inc., Vancouver (CA)

( * ) Notice: Subject to any disclaimer, the term of this patent is extended or adjusted under 35 U.S.C. 154(b) by 0 days.

(21) Appl. No.: 10/321,941

(22) Filed: Dec. 17, 2002

(65) Prior Publication Data

US 2004/0012407 A1 Jan. 22, 2004

Related U.S. Application Data

(60) Provisional application No. 60/349,663, filed on Jan. 15, 2002, and provisional application No. 60/341,974, filed on Dec. 18, 2001.

(51) Int. Cl.[7] ............................................. H01L 39/02
(52) U.S. Cl. ............................. 257/34; 257/33; 257/36; 505/190; 505/193; 326/3; 326/4
(58) Field of Search ............................. 326/1–7; 257/33, 257/34, 36, 39; 505/190, 193

(56) References Cited

U.S. PATENT DOCUMENTS

| 5,157,466 A | 10/1992 | Char et al. .................... 257/33 |
| 5,323,344 A | 6/1994 | Katayama et al. .......... 365/162 |

(List continued on next page.)

FOREIGN PATENT DOCUMENTS

WO    WO03090162 A2    10/2003

OTHER PUBLICATIONS

D.V. Averin, "Quantum Nondemolition Measurements of a Qubit," Phys. Rev. Lett. 88, 207901 (2002).
G. Blatter, V.B. Geshkenbein, and L. Ioffe, "Engineering Superconducting Phase Qubits," Phys. Rev. B 63, 174511 (2001).

(List continued on next page.)

*Primary Examiner*—Vibol Tan
(74) *Attorney, Agent, or Firm*—Knobbe Martens Olson & Bear LLP

(57) ABSTRACT

In one embodiment, a two-junction phase qubit includes a superconducting loop and two Josephson junctions separated by a mesoscopic island on one side and a bulk loop on another side. The material forming the superconducting loop is a superconducting material with an order parameter that violates time reversal symmetry. In one embodiment, a two-junction phase qubit includes a loop of superconducting material, the loop having a bulk portion and a mesoscopic island portion. The loop further includes a relatively small gap located in the bulk portion. The loop further includes a first Josephson junction and a second Josephson junction separating the bulk portion from the mesoscopic island portion. The superconducting material on at least one side of the first and second Josephson junctions has an order parameter having a non-zero angular momentum in its pairing symmetry. In one embodiment, a qubit includes a superconducting loop having a bulk loop portion and a mesoscopic island portion. The superconducting loop further includes first and second Josephson junctions separating the bulk loop portion from the mesoscopic island portion. The superconducting loop further includes a third Josephson junction in the bulk loop portion. In one embodiment, the third Josephson junction has a Josephson energy relatively larger than a Josephson energy of the first and second Josephson junctions.

28 Claims, 13 Drawing Sheets

U.S. PATENT DOCUMENTS

| | | | | |
|---|---|---|---|---|
| 5,917,322 | A | 6/1999 | Gershenfeld et al. | 324/307 |
| 6,128,764 | A | 10/2000 | Gottesman | 714/785 |
| 6,459,097 | B1 | 10/2002 | Zagoskin | 257/31 |
| 6,495,854 | B1 | 12/2002 | Newns et al. | 257/31 |
| 6,504,172 | B2 | 1/2003 | Zagoskin et al. | 257/14 |
| 6,563,311 | B2 | 5/2003 | Zagoskin | 324/248 |
| 6,605,822 | B1 * | 8/2003 | Blais et al. | 257/34 |
| 6,614,047 | B2 * | 9/2003 | Tzalenchuk et al. | 257/34 |
| 6,627,916 | B2 | 9/2003 | Amin et al. | 257/31 |
| 2002/0117656 | A1 | 8/2002 | Amin et al. | 257/9 |
| 2002/0188578 | A1 | 12/2002 | Amin et al. | 706/15 |
| 2003/0027724 | A1 | 2/2003 | Rose et al. | 505/210 |
| 2003/0102470 | A1 | 6/2003 | Il'ichev et al. | 257/31 |
| 2003/0107033 | A1 | 6/2003 | Tzalenchuk et al. | 257/31 |
| 2003/0164490 | A1 | 9/2003 | Blais | 257/14 |
| 2003/0207766 | A1 | 11/2003 | Esteve et al. | 505/190 |
| 2003/0224944 | A1 | 12/2003 | Il'ichev et al. | 505/170 |

OTHER PUBLICATIONS

D. Born, T. Wagner, W. Krech, U. Hubner, and L. Fritzch, "Fabrication of Ultrasmall Tunnel Junctions by Electron Beam Direct–Writing", IEEE Trans. App. Supercond. 11, pp. 373–376 (2001).

H. Hilgenkamp, and J. Mannhart, "Grain Boundaries in High–$T_c$ Superconductors," Rev. Mod. Phys. 74, 485–544 (2002).

L.B. Ioffe, V.B. Geshkenbein, M.V. Feigel'man, A.L. Faucheáre, and G. Blatter, "Environmentally decoupled sds–wave Josephson junctions for quantum computing," Nature 398, pp. 679–681 (1999).

E. Il'chev, M. Grajcar, R. Hlubina, R. P. J. Ijsselsteijn, H. E. Hoenig, H.–G. Meyer, A Golubov, M. H. S. Amin, A. M. Zagoskin, A. N. Omelyanchouk, and M. Yu Kupriyanov, "Degenerate Ground State in a Mesoscopic $YBa_2Cu_3O_{7-x}$ Grain Boundary Josephson Junction," Phys. Rev. Lett. 86, pp. 5369–5372 (2001).

D. Koelle, R. Kleiner, F. Ludwig, E. Dantsker, and J. Clarke, "High–transition–temperature superconducting quantum interference devices," Rev. Mod. Phys. 71, pp. 631–686 (1999).

A.N. Korotkov, "Continuous quantum measurement of a double dot," Phys. Rev. B 60, pp. 5737–5742 (1999).

A.N. Korotkov, "Selective quantum evolution of a qubit state due to continuous measurement," Phys. Rev. B 63, 115403 (2001).

D.A. Lidar and L.–A. Wu, "Reducing Constraints on Quantum Computer Design by Encoded Selective Recoupling," arXiv.org: quant–ph/0109021v1 (2001), website arxiv.org/abs/quant–ph/0109021 last accessed on Feb. 23, 2004.

F. Lombardi, A. Ya. Tzalenchuk, S.E. Kubatkin, F. Tafuri, Z.G. Ivanov, P. Delsing, and T. Claeson, "Transport properties of sub–micron $YBa_2Cu_3O_{7-d}$ step–edge Josephson junctions," Physica C 368, pp. 337–342 (2002).

A. Maassen van den Brink, "Quantum–efficient charge detection using a single–electron transistor," Europhys. Lett. 58, pp. 562–568 (2002).

Y. Makhlin, G. Schön, and A. Shnirman, "Quantum–State Engineering with Josephson–Junction Devices," Rev. Mod. Phys. 73, pp. 357–401 (2001).

C.C. Tsuei and J.R. Kirtley, "Pairing symmetry in cuprate superconductors," Rev. Mod. Phys. 72, pp. 969–1016 (2000).

A.M. Zagoskin, "d–Wave superconductors and quantum computing," Physica C 368, pp. 305–309 (2002).

* cited by examiner

MULTI-JUNCTION PHASE QUBIT

REFERENCE TO RELATED APPLICATIONS

The present application claims priority from U.S. Provisional Application No. 60/341,974, titled "Characterization and Measurement of Superconducting Structures" filed Dec. 18, 2001. The present application also claims priority from U.S. Provisional Application No. 60/349,663, titled "Two-Junction D-Wave Qubit" filed Jan. 15, 2002, the entire contents of which are hereby incorporated by reference.

BACKGROUND

1. Field of the Invention

The invention relates to the field of quantum computing, and particularly to superconducting quantum computing.

2. Description of the Related Art

Research on what is now called quantum computing traces back to Richard Feynman. See, e.g., R. P. Feynman, Int. J. Theor. Phys. 21, 467 (1982). He noted that quantum systems are inherently difficult to simulate with classical (i.e., conventional, non-quantum) computers, but that this task could be accomplished by observing the evolution of another quantum system. In particular, solving a theory for the behavior of a quantum system commonly involves solving a differential equation related to the system's Hamiltonian. Observing the behavior of the system provides information regarding the solutions to the equation.

Further efforts in quantum computing were initially concentrated on building the formal theory or computer science of quantum computing. Discovery of the Shor and Grover algorithms were important milestones in quantum computing. See, e.g., P. Shor, SIAM J. of Comput. 26, 1484 (1997); L. Grover, Proc. 28th STOC, 212 (ACM Press, New York, 1996); and A. Kitaev, LANL preprint quant-ph/9511026. In particular, the Shor algorithm permits a quantum computer to factorize large natural numbers efficiently. In this application, a quantum computer could render obsolete all existing "public-key" encryption schemes. In another application, quantum computers (or even a smaller-scale device such as a quantum repeater) could enable absolutely safe communication channels where a message, in principle, cannot be intercepted without being destroyed in the process. See, e.g., H. J. Briegel et al., preprint quant-ph/9803056 and references therein: showing that fault-tolerant quantum computation is theoretically possible and opens the way for attempts at practical realizations. See, e.g., E. Knill, R. Laflamme, and W. Zurek, Science 279, 342 (1998).

Quantum computing generally involves initializing the states of N quantum bits (qubits), creating controlled entanglements among them, allowing these states to evolve, and reading out the states of the qubits after the evolution. A qubit is typically a system having two degenerate (i.e., of equal energy) quantum states, with a non-zero probability of being found in either state. Thus, N qubits can define an initial state that is a combination of $2^N$ classical states. This initial state undergoes an evolution governed by the interactions that the qubits have among themselves and with external influences. This evolution of the states of N qubits defines a calculation or, in effect, $2^N$ simultaneous classical calculations. Reading out the states of the qubits after evolution is complete determines the results of the calculations.

Several physical systems have been proposed for the qubits in a quantum computer. One system uses molecules having degenerate nuclear-spin states. See, e.g., N. Gershenfeld and I. Chuang, "Method and Apparatus for Quantum Information Processing," U.S. Pat. No. 5,917,322. Nuclear magnetic resonance (NMR) techniques can read the spin states. These systems have successfully implemented a search algorithm, see, e.g., M. Mosca, R. H. Hansen, and J. A. Jones, "Implementation of a quantum search algorithm on a quantum computer," Nature 393, 344 (1998) and references therein, and a number-ordering algorithm, see, e.g., L. M. K. Vandersypen, M. Steffen, G. Breyta, C. S. Yannoni, R. Cleve, and I. L. Chuang, "Experimental realization of order-finding with a quantum computer," preprint quant-ph/0007017 and references therein. (The number-ordering algorithm is related to the quantum Fourier transform, an essential element of both Shor's factoring algorithm and Grover's algorithm for searching unsorted databases.) However, expanding such systems to a commercially useful number of qubits is difficult. More generally, many of the current proposals will not scale up from a few qubits to the $10^2 \sim 10^3$ qubits needed for most practical calculations.

Further, current methods for entangling qubits are susceptible to loss of coherence. Entanglement of quantum states of qubits can be an important step in the application of quantum algorithms. See for example, P. Shor, SIAM J. of Comput., 26:5, 1484–1509 (1997). Current methods for entangling phase qubits require the interaction of the flux in each of the qubits, see Yuriy Makhlin, Gerd Schon, Alexandre Shnirman, "Quantum state engineering with Josephson-junction devices," LANL preprint, cond-mat/0011269 (November 2000). This form of entanglement is sensitive to the qubit coupling with surrounding fields, which cause decoherence and loss of information.

Currently proposed methods for readout, initialization, and entanglement of a qubit involve detection or manipulation of magnetic fields at the location of the qubit, which make these methods susceptible to decoherence and limits the overall scalability of the resulting quantum computing device. Thus, there is a need for an efficient quantum register where decoherence and other sources of noise are minimized but where scalability is maximized.

SUMMARY OF THE INVENTION

In one embodiment, a two-junction phase qubit includes a superconducting loop and two Josephson junctions separated by a mesoscopic island on one side and a bulk loop on another side. The material forming the superconducting loop is a superconducting material with an order parameter that violates time reversal symmetry.

In one embodiment, a method is provided for controlling an information state of a qubit having a superconducting loop that includes a bulk loop portion, a mesoscopic island portion, and two Josephson junctions separating the bulk loop portion from the mesoscopic island portion. The method includes applying a bias across the mesoscopic island portion. In one embodiment, the method includes driving a bias current in the superconducting loop. In one embodiment, the method includes driving a bias current in the superconducting loop by coupling a magnetic flux into the superconducting loop.

In one embodiment, a qubit apparatus includes a superconducting loop having a bulk loop portion, a mesoscopic island portion, and two Josephson junctions separating the bulk loop portion from the mesoscopic island portion. A control system is provided for applying a bias current across the mesoscopic island portion. In one embodiment, the control system includes a tank circuit inductively coupled to the superconducting loop.

In one embodiment, a method for fabricating a Josephson junction includes, depositing a relatively thin film of superconducting material, depositing an amorphous carbon layer onto the superconducting material, etching a qubit pattern onto a chromium mask, transferring the qubit pattern to the amorphous carbon layer by patterning through the chromium mask, etching the pattern into the superconducting material, and removing the amorphous carbon layer from the superconducting layer. In one embodiment, the superconducting layer is deposited by pulsed laser deposition. In one embodiment, one or more layers of gold are deposited onto the superconducting layer. In one embodiment the amorphous carbon layer is deposited by e-beam evaporation. In one embodiment, the etching includes argon ion milling.

In one embodiment, a two-junction phase qubit includes a loop of superconducting material, the loop having a bulk portion and a mesoscopic island portion. The loop further includes a relatively small gap located in the bulk portion. The loop further includes a first Josephson junction and a second Josephson junction separating the bulk portion from the mesoscopic island portion. The superconducting material on at least one side of the first and second Josephson junctions has an order parameter having a non-zero angular momentum in its pairing symmetry.

In one embodiment, a qubit includes a superconducting loop having a bulk loop portion and a mesoscopic island portion. The superconducting loop further includes first and second Josephson junctions separating the bulk loop portion from the mesoscopic island portion. The superconducting loop further includes a third Josephson junction in the bulk loop portion. In one embodiment, the third Josephson junction has a Josephson energy relatively larger than a Josephson energy of the first and second Josephson junctions.

DETAILED DESCRIPTION

Figure 1:
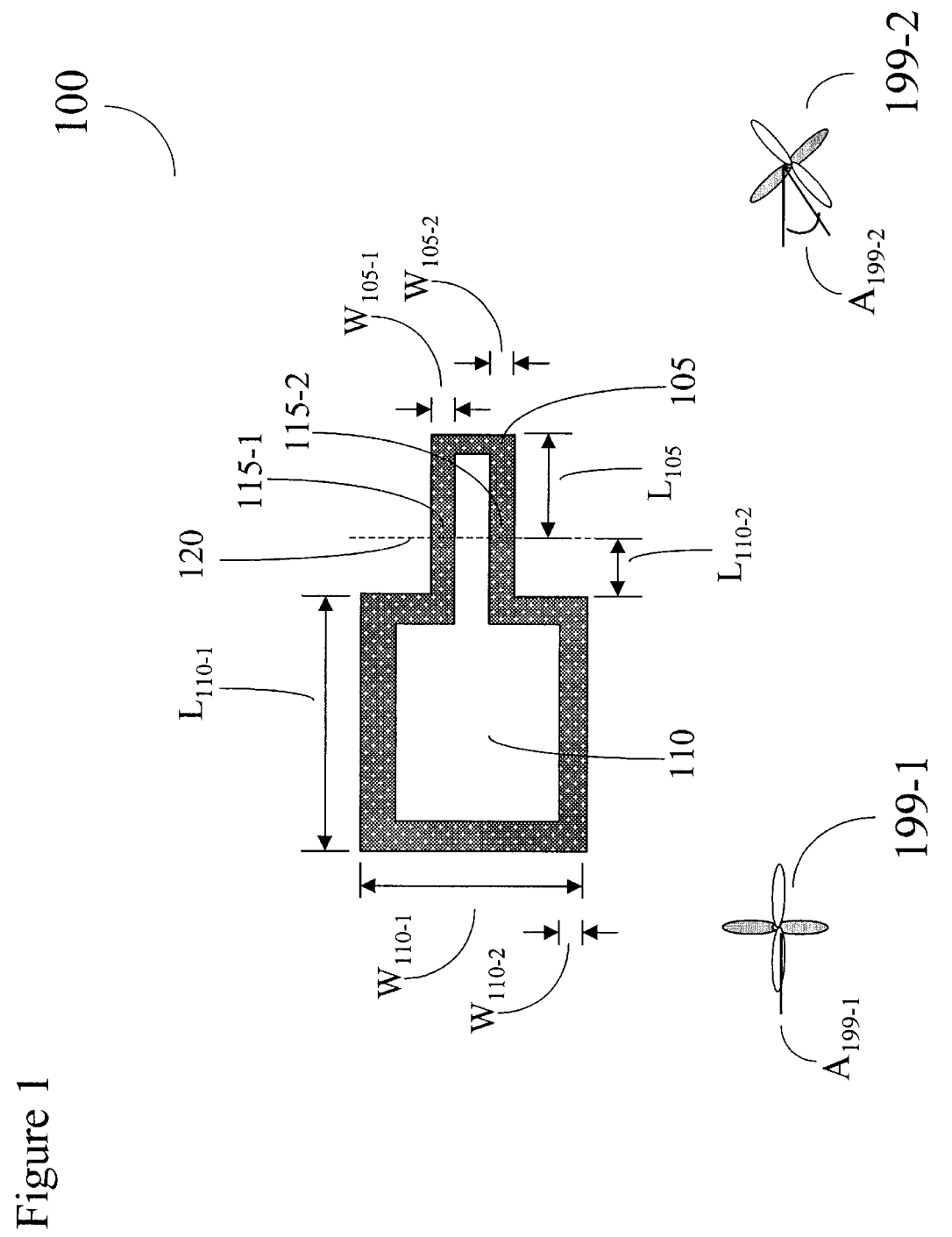
FIG. 1 is a plan view of a two-junction phase qubit having a superconducting loop with first and second regions.

In one embodiment, a two-junction phase qubit includes a superconducting loop and two Josephson junctions, wherein the two Josephson junctions isolate a region of the superconducting loop forming a mesoscopic island. In one embodiment, the two Josephson junctions and mesoscopic island can be isolated from the bulk of the superconducting loop. The size of the mesoscopic island portion of the loop can be relatively less than the size of the remaining superconducting loop.

The device operates at a temperature such that thermal excitations in the superconducting crystal lattice are sufficiently suppressed to perform quantum computation. In one embodiment, such a temperature can be on the order of 1K (Kelvin) or less. In one embodiment, such a temperature can be on the order of 50 mK (milliKelvin) or less. Furthermore, other dissipative sources, such as magnetic fields for example, should be minimized to an extent such that quantum computing can be performed with relatively little dissipation and decoherence.

In one embodiment, a two-junction phase qubit is formed out of an unconventional superconducting material having a non-zero angular momentum in the pairing symmetry of its order parameter. For example, this occurs in high-Tc cuprates such as $YBa_2Cu_3O_{7-x}$, where x takes on values between 0.0 and 0.6, or $Bi_2Sr_2Ca_{n-1}Cu_nO_{2n+4}$, $Tl_2Ba_2CuO_{6+x}$, or $HgBa_2CuO_4$. An example of a low temperature superconductor with non-zero angular momentum is $Sr_2RuO_4$, which has p-wave superconducting pairing symmetry of its order parameter. Another example of a p-wave superconductor is the heavy fermion material $CeIrIn_5$. The Josephson junctions can be grain boundary Josephson junctions, wherein the crystal lattice orientation of the superconducting material on one side of the grain boundary varies from the crystal lattice orientation of the superconducting material on the other side of the grain boundary. Fabrication and behavior of grain boundary Josephson junctions is well known and described in the art. See, e.g., E. Il'ichev, M. Grajcar, R. Hlubina, R. Ijsselsteijn, H. Hoenig, H. Meyer, A. Golubov, M. Amin, A. Zagoskin, A. Omelyanchouk, and M. Kupriyanov, "Degenerate Ground State in a Mesoscopic $YBa_2Cu_3O_{7-x}$ Grain Boundary Josephson Junction", Phys. Rev. Letters, 86, 5369 (June 2001), and the references therein, each of which is incorporated by reference in its entirety. In one embodiment, grain boundary Josephson junctions provide for electron coherence and support of quantum effects. Furthermore, the Josephson junction can have sub-micron widths such that second harmonic effects are present. Methods for preparing grain boundary Josephson junctions useful for satisfying these requirements are described in detail below.

The substrate can be bi-crystal, thus facilitating the formation of a grain boundary upon deposition of a superconducting layer, or the substrate can be formed using bi-epitaxial fabrication methods. Methods for forming bi-epitaxial grain boundary junctions are well known and described in the art. See, e.g., F. Lombardi, A. Tzalenchuk, S. Kubatin, F. Tafuri, Z. Ivanov, P. Delsing, and T. Claeson, "Tunnel barriers for an all-high-$T_c$ single electron tunneling transistor", Physica C, 368, 337 (2002), herein incorporated in its entirety.

FIG. 1 illustrates one embodiment wherein a superconducting loop 100 includes a first region 110 and a second region 105. The region 110 is the bulk region of the superconducting loop 100, and the region 105 is the mesoscopic island region of the superconducting loop 100. The region 105 is differentiated from the bulk region 110 by the Josephson junctions 115-1 and 115-2.

The size of bulk region 110 is relatively larger than the size of the mesoscopic island region 105. The mesoscopic island region 105 can have widths $W_{105-1}$ and $W_{105-2}$ respectively, ranging from about 0.1 μm or less to 1 μm or more. The length $L_{105}$ can be on the order of more or less 1 μm, and can range between about 0.5 μm or less and 3 μm or more. The bulk region 110 can have an outer width $W_{110-1}$ in the range of 1 μm or less to 5 μm or more. Similarly, the outer length $L_{110-1}$ of the bulk region is in the range of 1 μm or less to 5 μm or more. The branch width $W_{110-2}$ can range from 0.1 μm or less to 1 μm or more. The length $L_{110-2}$ can range from 0 to 5 μm or more.

In one embodiment, the Josephson junctions 115-1 and 115-2 are grain boundary Josephson junctions, wherein the crystal lattice orientation of the superconducting material making up loop 100 can vary across the Josephson junctions 115-1 and 115-2. The crystal lattice orientation of a superconducting material substantially determines the orientation of the order parameter in that material. FIG. 1 illustrates order parameters 199-1 and 199-2 corresponding to regions on either side of the grain boundary 120. Order parameter 199-1 can have an angle of misorientation $A_{199-2}$ with respect to a line perpendicular to the orientation of grain boundary 120. Further, order parameter 199-2 can have an angle of misorientation $A_{199-2}$ with respect to a line perpendicular to the orientation of grain boundary 120. In one embodiment, angle $A_{199-1}$ is approximately 0° and angle $A_{199-2}$ is approximately 45°, such that Josephson junctions 115-1 and 115-2 form 0–45° Josephson junctions.

In one embodiment, widths $W_{105-1}$ and $W_{105-2}$ can be different. The difference between the widths $W_{105-1}$ and $W_{105-2}$ can tune characteristics of the qubit. When Josephson junctions 115-1 and 115-2 have different widths, the respective critical currents $I_{C1}$ and $I_{C2}$ are different. In this case, under the influence of a bias across the island, degeneracy is broken between the two energy minima associated with each of the basis states of the qubit. At small fluctuations of the bias across the island the free energy minima will remain degenerate, thus making the quantum state of the qubit robust against fluctuations such as external magnetic fields for example. As the amplitude of bias across the island increases, the degeneracy is broken, and it becomes possible to differentiate between each of the energy minima. In this situation, it is possible to induce sigma z, initialization, and readout operations as described in detail below. The consequence of differences between the Josephson junctions also reduces the constraints on reproducibility of Josephson junctions 115-1 and 115-2.

The two-junction phase qubit provides a quantum two-level system for performing quantum computation. Other qubits have previously been described. See, e.g., A. Zagoskin, U.S. patent application Ser. No. 09/452,749, "Permanent Readout Superconducting Qubit", (now U.S. Pat. No. 6,563,311, titled "Quantum Computing Method Using Magnetic Flux States at a Josephson Junction"), and the references therein, and J. Mooij, T. Orlando, L. Levitov, Lin Tian, C. van der Wal, and S. Loyd, "Josephson Persistent-Current Qubit", Science, 285, 1036 (August 1999), and the references therein, which are herein incorporated by reference in their entirety.

In one embodiment, the qubit of FIG. 1 supports naturally bi-stable energy states that form the basis states of the qubit. Prior art superconducting qubit proposals require flux biasing to achieve degenerate ground states for performing quantum computation. Accordingly, the strength of the biasing field for each prior art qubit is controlled to achieve the desired tunneling between its basis states.

Referring to FIG. 1, time-reversal symmetry breaking occurs at Josephson junctions 115-1 and 115-2. This results in two degenerate energy states for each of 115-1 and 115-2 respectively, which results in currents circulating clockwise and counter-clockwise at each of the junctions. Phase differences $\pm\Delta\phi_1$ and $\pm\Delta\phi_2$ represent the degenerate phase differences of Josephson junctions 115-1 and 115-2 respectively, and each phase difference correlates with a direction of circulation of persistent current at the respective junction. Thus, each junction 115-1 and 115-2 has a phase difference $|\Delta\phi_1|$ and $|\Delta\phi_2|$ respectively and two ground state energies that correlate with the positive and negative values of the respective phase difference. For example, if the persistent current at junctions 115-1 and 115-2 circulates clockwise, then the phase differences can be $+\Delta\phi_1$ and $+\Delta\phi_2$ respectively, and if the persistent current circulates counter-clockwise, then the phase differences can be $-\Delta\phi_1$ and $-\Delta\phi_2$ respectively. When the two junctions are connected together, the sum of the phases $\phi_1$ and $\phi_2$ of junctions 115-1 and 115-2 respectively is related to the external flux in bulk loop 110. In particular, $\phi_1+\phi_2=\phi_x$, where $\phi_x=2\pi\Phi_x/\Phi_0$, and $\Phi_0=h/2e$ is the flux quantum. When the external flux $\phi_x=0$, the phases of the junctions are related as $$\phi_1=-\phi_2, \qquad [1]$$

and only two of the four combinations of phase difference across junctions 115-1 and 115-2 respectively are allowed. Furthermore, the phase differences across junctions 115-1 and 115-2 anti-correlate (see Equation 1), such that if a first Josephson junction occupies a first phase difference $\pm\Delta\phi_1$, a second Josephson junction will occupy a second phase difference $\pm\Delta\phi_2$. For example, if junction 115-1 has a phase difference $+\Delta\phi_1$, then junction 115-2 will have a phase difference $-\Delta\phi_2$. Anti-correlation of the phase differences across junctions 115-1 and 115-2 is correlated with a bias current across mesoscopic island 105. In the example above, a bias current passing across mesoscopic island 105 such that it passes junction 115-1 first and 115-2 second will create the above-described phase differences across the junctions respectively, whereas a bias current passing across mesoscopic island 105 in the opposite direction will result in $+\Delta\phi_2$ across junction 115-2 and $-\Delta\phi_1$ across junction 115-1. Thus, the basis states of mesoscopic island 105 can correlate with the direction of current circulating in the bulk loop, and this forms a mechanism for interacting with the state of the qubit.

Referring again to FIG. 1, both the mesoscopic size of mesoscopic island 110 combined with the characteristics of Josephson junctions 115-1 and 115-2 allow the system to be in a superposition of states. The device has two potential energy wells with respect to phase and a potential barrier separating the wells such that the probability for quantum tunneling to occur between the potential wells is finite. For example, if the system begins in a first potential well, having a lower energy than the potential barrier separating the potential wells, it will have an increasing probability of tunneling to a second potential well over time. At some time t/4 after initialization, the device will have an equal probability of being in either the first potential well or the second potential well. Further, after a time t/2, the state of the device will have a 100% chance of being in the opposite state to which it was initialized. Thereafter the state of the device will continue to evolve in a coherent oscillation between the first and second potential wells with a period t. The frequency of this evolution is called the tunneling amplitude of the device and the period t is related to the inverse of the tunneling amplitude. In some embodiments, the tunneling amplitude is between about 30 giga-Hertz (GHz) or more and about 500 mega-Hertz (MHz) or less. During evolution, the state of the system is in a superposition of the first and second potential wells. Each of the potential wells can then be used as the basis states of the qubit, and during quantum computation the state of the qubit exists in a superposition of the basis states and can evolve by quantum tunneling. Although the entire device is used to enable the qubit, the qubit state information is stored at the Josephson junctions 115-1 and 115-2 as a phase difference $\pm\Delta\phi$ as described above.

Although evolution of the state of the qubit does not necessarily fluctuate with directional current flow in the bulk loop, it is possible to impose directional current in the bulk loop via external flux for example, and thus affect the state of the mesoscopic island during computation. This provides a mechanism for interacting with the state of the qubit.

In order to perform quantum computation, an array of one or more qubits, hereinafter referred to as a quantum register, typically provides a universal set of basic quantum operations, such that any quantum gate can be implemented. In some cases, the universal set can include a $\hat{\sigma}_x$ tunnel operation, a $\hat{\sigma}_z$ or bias operation, and an entanglement operation. The $\hat{\sigma}_x$ matrix is correlated with the tunneling amplitude of the qubit for each qubit in the quantum register. The operators $\hat{\sigma}_x$ and $\hat{\sigma}_z$ are the well known Pauli matrices which, for a two-state system, can be represented as shown in Equations 2 and 3.

$$\hat{\sigma}_x = \begin{pmatrix} 0 & 1 \\ 1 & 0 \end{pmatrix} \quad [2]$$

$$\hat{\sigma}_z = \begin{pmatrix} 1 & 0 \\ 0 & -1 \end{pmatrix} \quad [3]$$

Control of the tunneling operation or $\hat{\sigma}_x$ is not necessary due to the advantage of naturally degenerate basis states as long as the tunneling is effectively suppressed while the other operations are applied. For example, the other operations can be controlled with a time constant $\tau_c$, such that $\tau_c \leq \Delta^{-1}$, where $\Delta$ is the tunneling amplitude of the qubit. Furthermore, if the other quantum gates require a time $\tau_c \geq \Delta^{-1}$, refocusing techniques can be applied to maintain the correct state in the qubit. Refocusing techniques are well known in the art and described in D. Lidar, and L. Wu, "Reducing Constraints on Quantum Computer Design by Encoded Selective Recoupling," LANL quant-ph/0109021, September, 2001, which is herein incorporated in its entirety.

In one embodiment, a mechanism for controlling the information state of the qubit includes application of a bias across the mesoscopic island region of the device. Applying a bias across the mesoscopic island can include driving a bias current in the superconducting loop. The information state of the mesoscopic island can be manipulated depending on the direction and magnitude of the bias. Driving a bias current across the mesoscopic island can include threading bulk loop 110 with a magnetic flux.

Figure 2:
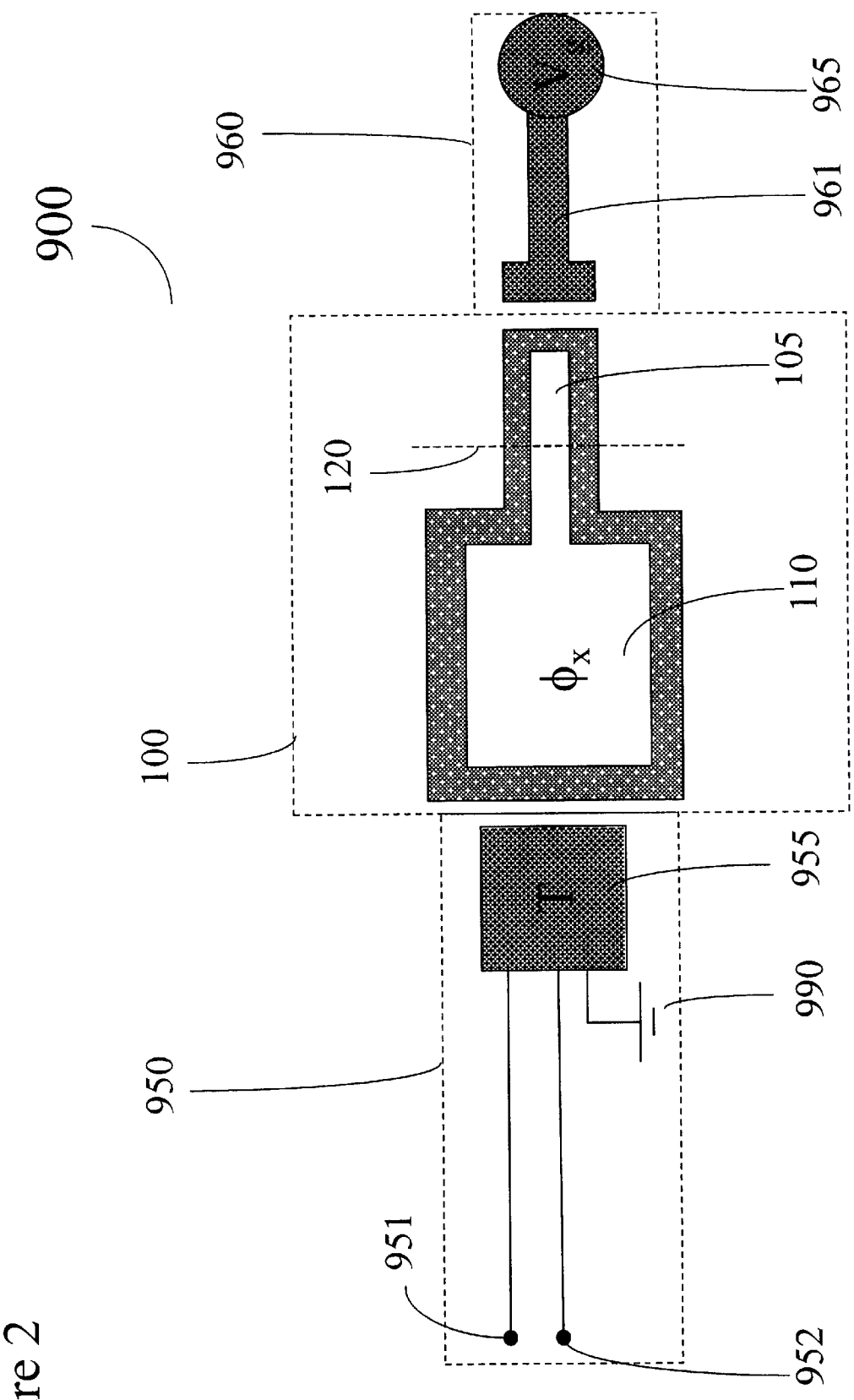
FIG. 2 is a plan view of the qubit of FIG. 1 and a control system that includes a first portion that is inductively coupled to the bulk loop region of the two-junction phase qubit, and a second portion that is capacitively coupled to mesoscopic island region of the two-junction phase qubit 100.

FIG. 2 shows an example of a control system that includes portions 950 and 960, wherein portion 950 is inductively coupled to the bulk loop region 110 of two-junction phase qubit device 100, and portion 960 is capacitively coupled to mesoscopic island region 105 of two-junction phase qubit 100. Portion 950 provides a mechanism for directionally threading bulk loop 110 with a magnetic flux $\phi_x$, thus providing a mechanism for applying a bias current across mesoscopic island 105. Portion 950 is inductively coupled to qubit 100. In one embodiment, the portion 950 includes a tank circuit that includes input and output leads 951 and 952 respectively, an inductor/capacitor resonant tank circuit 955, and a ground 990. In one embodiment, the portion 950 includes a dc-SQUID or another device that can be inductively coupled to the qubit 100 such that changes in the state of the qubit 100 to affect measurable properties of the portion 950. A control system such as the portion 950 is described in detail in U.S. provisional application serial No. 60/341,794, E. Il'ichev and M. Grajcar, "Characterization and Measurement of Superconducting Structures", filed Dec. 18, 2001, and the references therein, herein incorporated by reference in its entirety.

Tank circuits include one or more networks of inductors and capacitors having a characteristic resonance frequency $\omega_R$. Referring to FIG. 2, tank circuit 955 can be designed from superconducting material or normal conductors, and can be a free standing circuit or an integrated circuit on a substrate. Tank circuit 955 can have a high quality factor, Q, a value in excess of about 1000 is sufficient for some embodiments of qubit 100. The quality factor Q is defined as the ratio of the resonance frequency to the spectral width (full width half maximum) of a resonance response curve.

One embodiment includes a mechanism for applying a flux threading of the bulk loop portion of a qubit, wherein the qubit is a two-junction phase qubit. A mechanism for applying flux can be control system 950 for example, as illustrated in FIG. 2. Tank circuit 955 is inductively coupled to qubit 100. This can be accomplished by enclosing the qubit 100 in a loop of the tank circuit 955 or by any other type of inductive coupling that relies on the well known physical principle of mutual inductance. The tank circuit 955 is driven at measurement frequency, $\omega_m$, within about half the nominal spectral width of the resonance frequency, $\omega_R$, i.e. $\omega_m = \omega_R \pm \omega_R/(2Q)$, having an AC current $I_{rf}$ and a DC bias current $I_{dc}$ comprising the current components that drive the tank. The flux generated by the different current components threads qubit 100. The applied flux is therefore denoted $\phi_e = \phi_{dc} + \phi_{rf}$, where the amplitude of $\phi_{rf}$ is much less than one flux quantum. The components of the applied flux can be varied to provide a bias flux. This flux bias can act with $\hat{\sigma}_z$ coupling on the state of qubit 100, providing the facility to interact with the qubit.

The control system illustrated in FIG. 2 can perform the operations required to use qubit 100 for quantum computation. Specifically, control system 950 can perform initialization, readout, and bias operations, and control system 960 can perform tunnel operations.

One embodiment includes a method for initializing the state of a qubit, wherein the qubit includes a two-junction phase qubit, includes biasing the bulk loop region of the device. Application of a bias to the bulk loop region can include threading the loop with a magnetic flux. This can induce current in the bulk loop region of the device, thus preferentially selecting one of the energy states of the island, depending on the direction of the current and corresponding flux bias. For example, if a flux bias $\phi_x$ correlates with a first ground state energy of the mesoscopic island or the $|0\rangle$ basis state, and a flux bias $-\phi_x$ correlates with a second ground state energy of the mesoscopic island or the $|1\rangle$ basis state, then application of $\phi_x$ will initialize the qubit to the $|0\rangle$ basis state, and application of $-\phi_x$ will initialize the qubit to the $|1\rangle$ basis state.

Referring to FIG. 2, a system for performing a readout operation on the qubit 100 includes a mechanism for applying a flux through the bulk loop 110, and a mechanism for measuring the response of said mechanism once the flux is applied. In one embodiment, a mechanism for applying flux through the bulk loop 110 includes the tank circuit 955, a ground 990, and input and output leads 951 and 952 respectively. Such a mechanism is illustrated by the control system 950. A method for performing a readout operation on the qubit 100 includes driving the tank circuit 955 at some value such that a flux $\phi_x$ threads the bulk loop 110 of the qubit 100, and measuring the output of the control system 950. The output of the control system 950 will depend on the collapsed or classical state of the qubit 100. Such a collapsed state means that the qubit 100 contains only information in the |0> or |1>basis states, and no longer contains a superposition of its basis states.

In one embodiment, a mechanism for applying flux through the bulk loop 110 includes inductively coupling a dc-SQUID to the bulk loop 110. In one embodiment, mechanisms useful for applying flux through the bulk loop 110 include a device that can controllably couple to the bulk loop 110.

Features illustrated in FIG. 2 can be used to perform a readout operation on the state of the qubit 100. The state of the qubit 100 affects the characteristics of the portion 950 and therefore the state of qubit 100 can be deduced based on measurement of the portion 950. This is a singular method similar in procedure to what is taught in U.S. provisional application serial No. 60/341,794, incorporated by reference above, where a method for determining the relation, or calibration curve, of the free energy of the qubit 100 to the external flux, $\phi_x$ is disclosed. The calibration curve can then be used to correlate readout operation information with the respective basis state of the qubit. One embodiment includes a method for interacting with the qubit 100 by applying a flux, measuring the portion 950, and post-processing the gathered information. For example, an applied flux $\phi_x$ can be changed while the phase difference between the applied current and response voltage in the portion 950 is monitored. In one embodiment, a changing applied flux includes providing a driving current $I_{rf}$ through a mechanism that is inductively coupled to the qubit. Driving current $I_{rf}$ can include direct and alternating current components. The direct current (dc) component biases the state of the qubit to break degeneracy between the basis states, whereas the alternating current (ac) component can induce resonance in the tank circuit. The impedance of the portion 950 at resonance will depend on the state of the coupled qubit, thus the phase angle between the driving current $I_{rf}$ and the output voltage, as measured across the leads 951 and 952 (in FIG. 2) can then be recorded as a function of external magnetic flux. From this relation, the state of the qubit can be determined by post-processing techniques. Specifically, the phase difference versus applied flux relation must be converted to a free energy versus applied flux. Given that the calibration curves for any flux qubit are highly hysteretic, the state of qubit 100 can be determined.

The above mentioned post-processing is useful for calibration. Information about the qubit 100 can be inferred from the energy-phase relation of the device. The energy versus phase profile of the qubit is determined by numerical integration of the phase difference versus applied flux. This will yield an energy phase profile that can be compared to the calibration curve. This is one method for determining the state of the qubit using this apparatus. Other methods will be apparent to one of ordinary skill in the art after reading the disclosure herein.

Referring again to FIG. 2, the control system 950 enables the biasing operation on the qubit 100. A method for applying a bias operation, or $\hat{\sigma}_z$ quantum gate, on the qubit 100 includes directionally driving current through the qubit 100. One embodiment includes a mechanism for driving current through qubit 100 includes threading bulk loop 110 with a magnetic flux. The control system 950 is an example of a mechanism for applying such a flux through the bulk loop 110. The direction of the magnetic flux correlates with the direction of the current in the qubit 100 and thus correlates with the respective basis state of the qubit 100. The magnitude of the flux required for achieving a bias operation is relatively less than the flux required for initializing the state of the qubit.

In one embodiment, the control system is weakly coupled to the qubit permitting nondestructive measurements to be performed. Referring to FIG. 2, the control system 950 can be weakly coupled to the quantum state of the qubit 100. Weak measurement of a qubit state results in a probabilistic estimate of the qubit state without collapsing its quantum state. This is in contrast to strong measurement, wherein the quantum state of the qubit is completely collapsed to a classical binary value when measurement occurs. Weak measurements are known in the art (see e.g., D. V. Averin, "Quantum Nondemolition Measurement of a Qubit", Physical Review Letters 88, 207901 (2002); A. Maassen van den Brink, "Quantum-efficient charge detection using a single-electron transistor", Europhysics Letters 58, pp. 562568 (2002); A. N. Korotkov, "Selective quantum evolution of a qubit state due to continuous measurement", Physical Review B 63, pp. 115403 (2001); A. N. Korotkov, "Continuous quantum measurement of a double dot", Physical Review B 60, pp. 5737–5742 (1999), each of which is hereby incorporated by reference in its entirety).

One embodiment includes a mechanism for controlling the tunneling amplitude $\Delta$. A mechanism for controlling the tunneling amplitude $\Delta$ of the qubit can include controlling the quasicharge of the mesoscopic island region of the qubit. In one embodiment, controlling the quasicharge of the mesoscopic island includes a capacitively coupled electrode in proximity to the mesoscopic island. In this respect the tunneling amplitude $\Delta$ depends on the gate voltage of the electrode applied to the mesoscopic island and the capacitance of the mesoscopic island. Referring to FIG. 2, the system 960 includes an electrode 961, capacitively coupled to the mesoscopic island 105, and a gate voltage 965 for controlling the charge of electrode 961.

Figure 3:
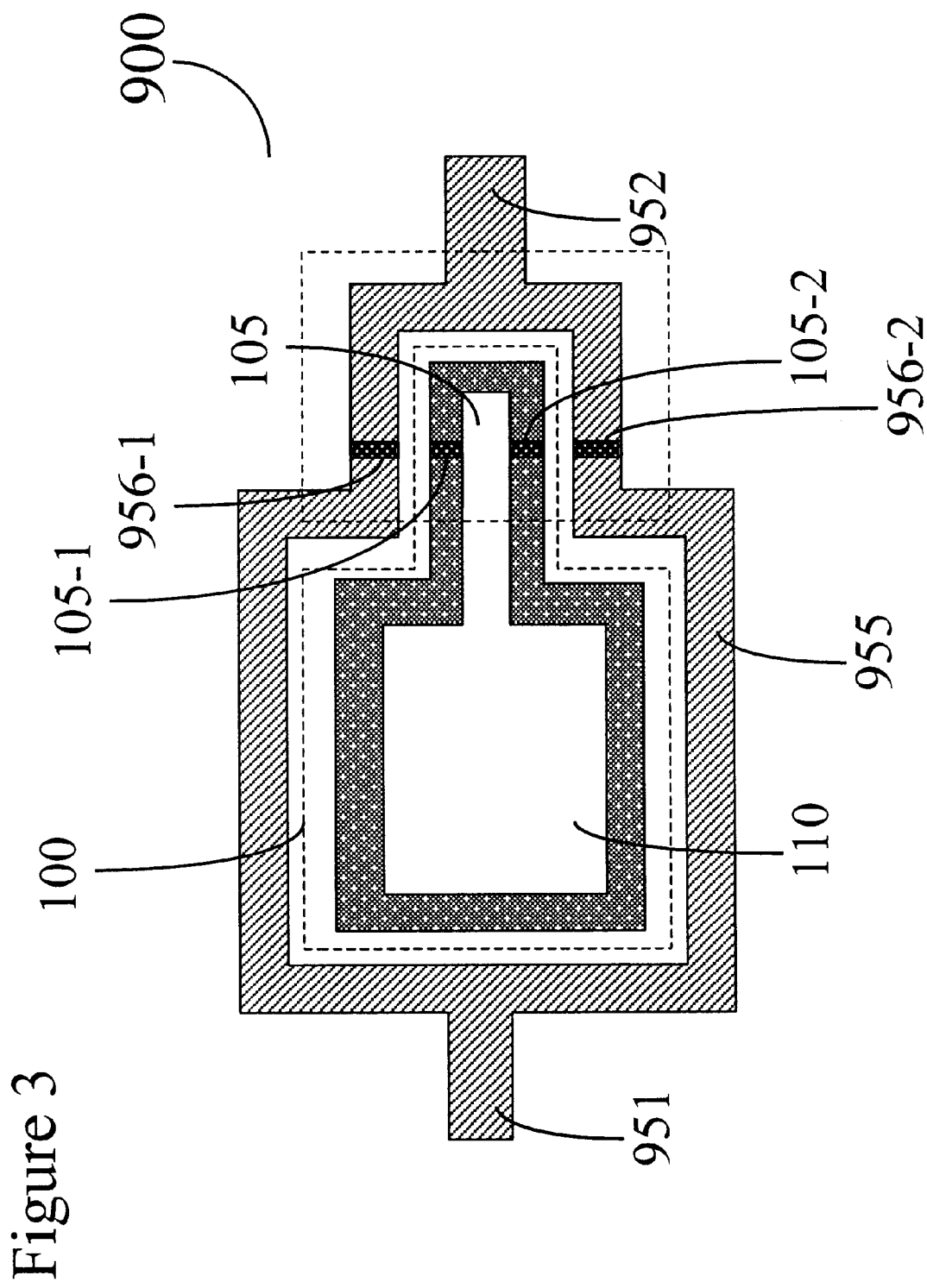
FIG. 3 illustrates a plan view of a qubit and respective control system where the qubit is inductively coupled to a dc-SQUID.

FIG. 3 shows a qubit inductively coupled to a dc-SQUID. The dc-SQUID includes a loop of superconducting material 955 having two leads 951 and 952 separated by Josephson junctions 956-1 and 956-2 in each branch of the loop. Fabrication and operation of a dc-SQUID is well known in the art. See, e.g., U.S. Pat. No. 5,157,466, Char et al., and the references therein, herein incorporated in its entirety. The dc-SQUID is an ultra-sensitive device for measuring magnetic fields. A magnetic field threading the loop of a dc-SQUID is converted to current that can be measured across the leads. A method for controlling qubit 100 with an inductively coupled dc-SQUID includes directionally driving current across the leads of the dc-SQUID. In one embodiment, controlling qubit 100 further includes measuring a voltage drop across the dc-SQUID. Driving a current through the dc-SQUID creates a magnetic flux that threads the inductively coupled qubit loop. This will create a circulating supercurrent in the qubit and correspondingly bias the basis state of the qubit that correlates with the direction of the circulating current. As described above in detail, stimulating supercurrent in the qubit can be used to realize initialization, readout, and bias operations.

A method for reading out the state of the qubit, where the dc-SQUID is inductively coupled to the qubit, includes driving a bias current through the dc-SQUID and measuring a voltage. The dc-SQUID passes supercurrent under the influence of a bias current, as long as the bias current is less than the critical current of the Josephson junctions in its branches. Once the bias current exceeds this value, a voltage will result across the leads of the dc-SQUID. Hereinafter this voltage will be referred to as the critical current of the dc-SQUID. When the dc-SQUID is inductively coupled to the qubit, the state of the qubit correlates with the supercurrent in the dc-SQUID. In operation, a definite flux in the qubit is measured and the direction or sign of the flux correlates with the state of the qubit. Measuring the flux in the qubit can be accomplished by passing a bias current through the dc-SQUID and measuring a potential difference. A bias current in the dc-SQUID will create a magnetic flux that inductively couples to the qubit loop, ultimately resulting in a collapse of the qubit quantum state.

Inductive coupling between the dc-SQUID and the qubit results in two distinct critical currents that can be used to perform measurements of the state of the qubit. In one embodiment, a bias current is ramped to a value that is greater than the lower of the two critical currents and less than the upper critical current. In operation, if a voltage results during such a readout, then it is determined that the qubit was in a state correlated with the lower critical current, whereas if no voltage results, then it is determined that the qubit was in a state correlated with the upper critical current. In one embodiment, the bias current is ramped to surpass both critical currents. In this embodiment, the time at which the voltage state occurs, as correlated with the bias current ramping rate, determines the state of the qubit. For example, at some point $t_1$ after the bias current begins a first critical current should result if the qubit is in a first state, and at some point $t_2$ after the bias current begins a second critical current should result if the qubit is in a second state.

In one embodiment, the dc-SQUID includes an unconventional superconducting material. For example, the dc-SQUID can involve the same material as the qubit, such as $YBa_2Cu_3O_{7-x}$, where x is greater than 0 and less than about 0.6.

In one embodiment, the dc-SQUID uses conventional superconducting material. The preparation and characteristics of Josephson junctions in both families of materials are well known in the art. The Josephson junctions can be grain boundary Josephson junctions for example. In one embodiment, the shape of the superconducting loop of the dc-SQUID can follow the shape of the qubit, allowing the Josephson junctions of the dc-SQUID to be close to the qubit Josephson junctions.

Quantum Register

Figure 4:
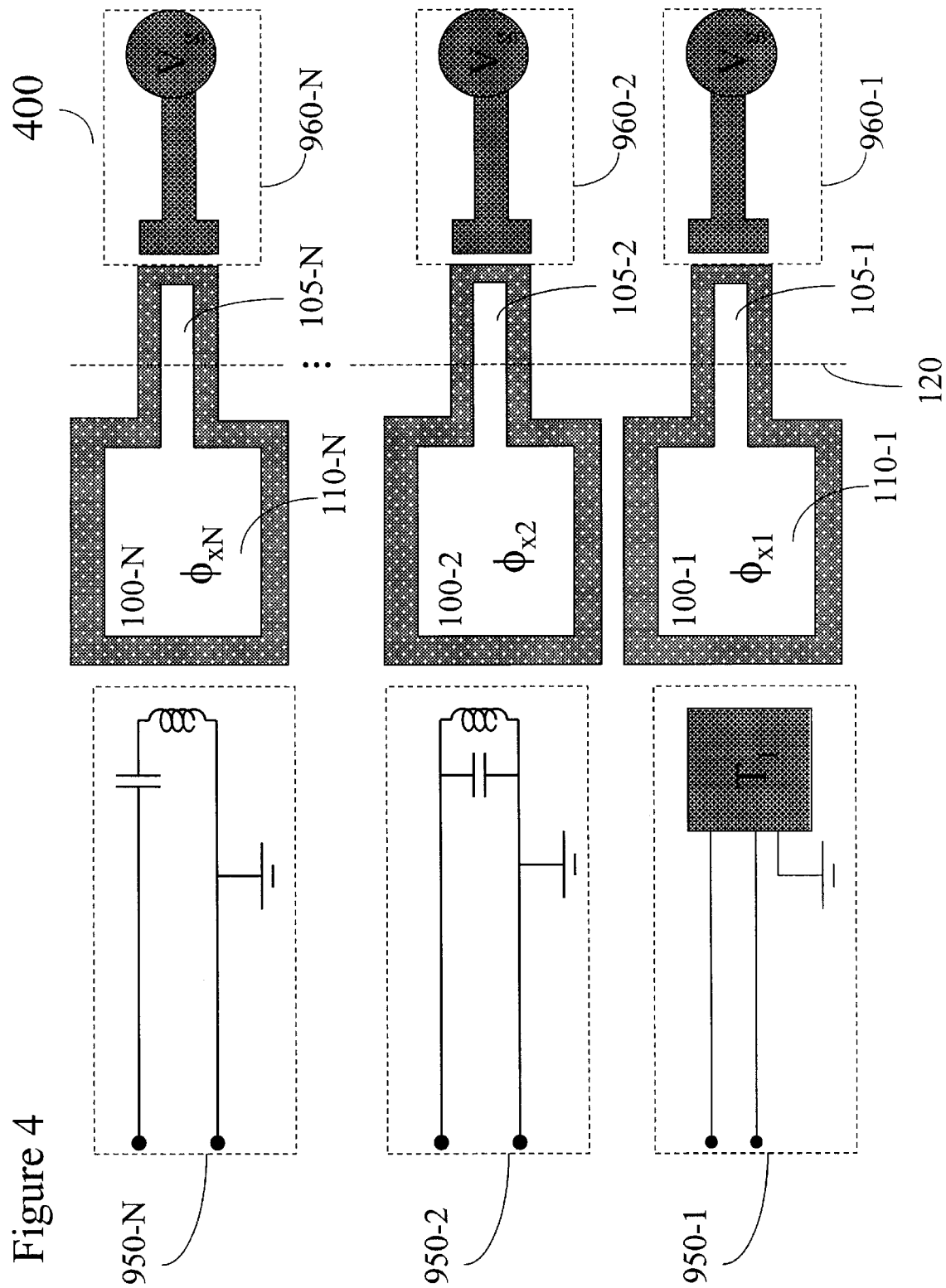
FIG. 4 illustrates a system for providing entanglement operations for qubits in a quantum register.

A quantum register includes an array of one or more qubits, wherein at least one of the qubits is a two-junction phase qubit. A quantum register can include a control system for controlling the information states of the qubits in the quantum register. FIG. 4 illustrates a quantum register 400 where the quantum register 400 includes an array of N qubits, 100-1 through 100-N. The quantum register 400 further includes control systems 950-1 through 950-N, and 960-1 through 960-N respectively. The control systems 960 and 950 are described in detail above as related to FIGS. 2 and 3. The control systems 960 and 950 are examples of systems for facilitating the necessary operations to perform quantum computation. For example, the control systems 950 and 960 provide mechanisms for performing initialization and readout operations, as well as bias operations, tunnel operations, and entanglement operations. The control system 950-N illustrates a series tank circuit, where the inductive and capacitive networks are in series with respect to the input and output leads. Control system 950-2 illustrates a parallel tank circuit, where the inductive and capacitive networks are in parallel with respect to the input and output leads. Control system 950-1 illustrates a system for inductively interacting with the qubit 100.

The entanglement operation, for which no classical or conventional computing analogy exists, controllably entangles the quantum states of selected qubits in the quantum register and is one of the main reasons for the power of quantum computation. See, e.g., U.S. Pat. No. 5,768,297, Peter Shor, "Method for reducing decoherence in quantum computer memory", filed October 1996, and the references therein, each of which is hereby incorporated by reference. In one embodiment, an entanglement operation can be a controlled phase shift (CP). Controlled phase shift operations are well known and described by the Pauli matrix of equation 4.

$$CP = \begin{pmatrix} 1 & 0 & 0 & 0 \\ 0 & -1 & 0 & 0 \\ 0 & 0 & -1 & 0 \\ 0 & 0 & 0 & 1 \end{pmatrix} \quad (4)$$

In order to perform an entanglement operation, the wave function of the qubits is allowed to overlap such that subsequent operations applied to one of the entangled qubits affects the other qubits involved in the entanglement operation.

A method for entangling adjacent qubits in a quantum register, where a quantum register includes an array of two or more qubits such that each of the qubits are spatially separated, includes applying a bias operation to adjacent qubits relatively simultaneously. In such a quantum register, flux bias operations applied to specific qubits will not affect neighboring qubits in the quantum register. However, when flux bias operations are performed on adjacent qubits in the quantum register, mutual inductance in the adjacent bulk loop regions will interact, thus entangling the states of the qubits involved. For example, if an external flux is applied to qubits N and N+1 in a quantum register, the qubit states will become entangled.

A method for entangling qubits in a quantum register, wherein a quantum register includes an array of two or more qubits, wherein at least one of the qubits includes a loop of superconducting material and two Josephson junctions, includes controlling a coherent coupling mechanism between the respective qubits to be entangled. In one embodiment, a coherent coupling mechanism includes a bus that is coupled to the mesoscopic islands of the respective qubits, and a coherent switch. The coherent switch controls the state of the bus. In operation, the coherent switch is closed for some duration, during which time the wave function representing the quantum state of the respective qubits overlap and become entangled. In one embodiment, the bus is capacitively connected to the mesoscopic islands of the respective qubits, resulting in charge-based coupling. In one embodiment, the bus is phase-coherently connected to the mesoscopic islands of the respective qubits, resulting in phase-based coupling. Further, the bulk regions of the loops of the respective qubits are connected to share a mutual constant phase. A mechanism for coherently coupling a bus to a mesoscopic island region of a qubit can include a Josephson junction separating the bus from the respective mesoscopic island. In one embodiment, a coherent switch includes a superconducting single electron transistor (SSET). The behavior of the SSET is found in P. Joyez et al., "Observation of Parity-Induced Suppression of Josephson Tunneling in the Superconducting Single Electron Transistor," Physical Review Letters, Vol. 72, No. 15, 11 April 1994, which is herein incorporated by reference in its entirety, and Born et al. "Fabrication of Ultrasmall Tunnel Junctions by Electron Beam Direct-Writing",. IEEE Trans. App. Superconductivity, 11, 373 (March 2001), which is herein incorporated by reference in its entirety.

Figure 5A:
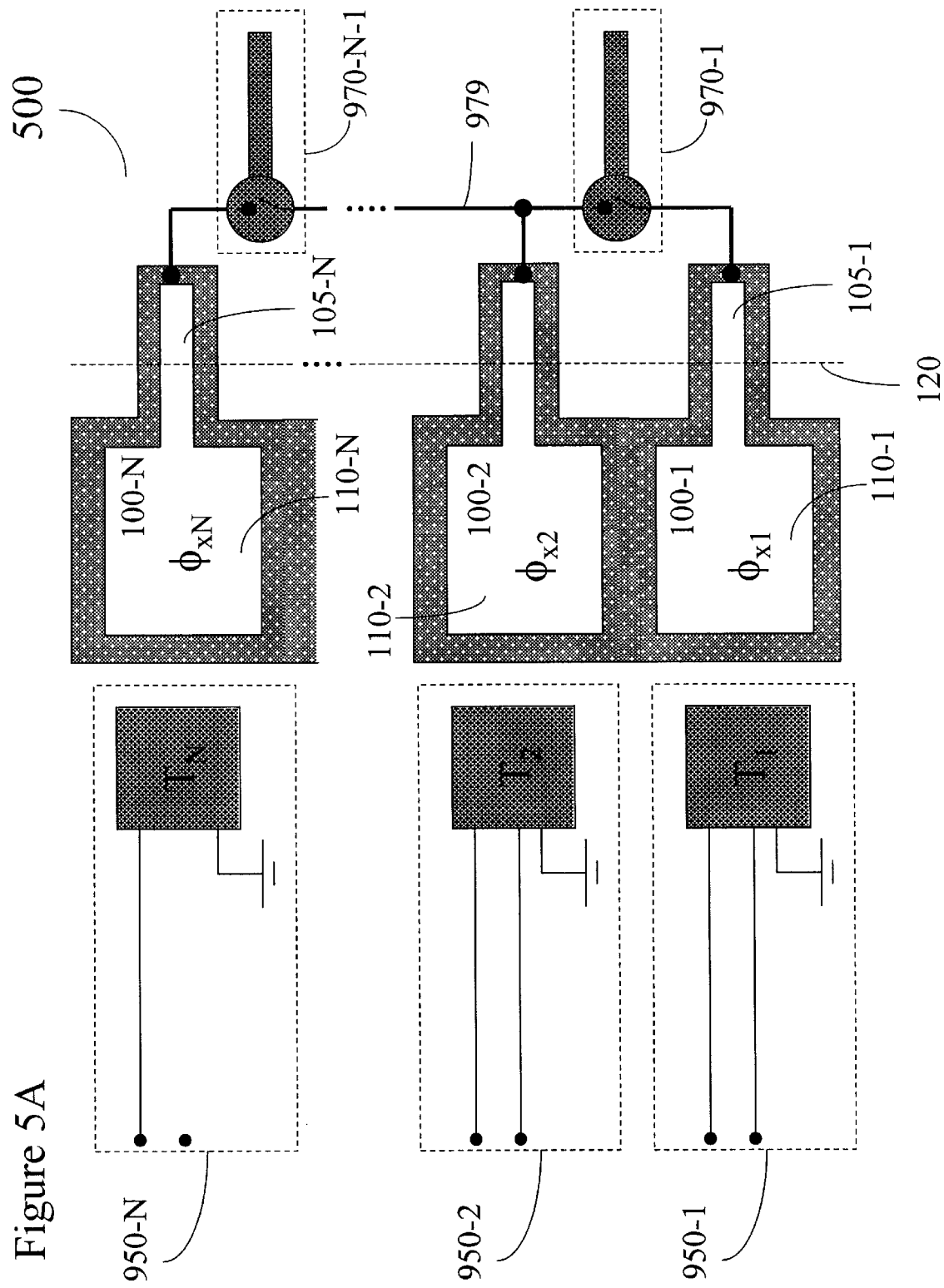
FIGS. 5A and 5B illustrate plan views of another quantum register and control system.

FIG. 5A illustrates a quantum register 500. The quantum register 500 includes an array of qubits 100-1 through 100-N, where adjacent qubits are spatially connected together through the bulk loop portions 110-1 through 110-N respectively. In FIG. 5, the bulk loop portions of qubit 100-1 through 100-N in quantum register 500 will have the same phase. Furthermore, quantum register 500 includes a control system 970-1 through 970-N-1, that includes a mechanism for controllably and coherently entangling the quantum states of adjacent mesoscopic islands 105-1 through 105-N respectively using a bus 979. In such a quantum register, each of the connected bulk loop regions of the qubit devices will have the same fixed phase with respect to one another. By coupling mesoscopic island regions of the respective qubits in the quantum register, the wave functions representing the quantum state of each of the qubits will overlap, leaving the quantum states of the respective qubits entangled. For example, in order to entangle qubits N and N+1 in such a quantum register, the meso scopic island regions of the respective qubits are coherently coupled to the bus 979 such that cuuent is permitted to move freely between the islands. A mechanism for coherently coupling the mesoscopic islands of qubits can include a SSET. Methods for coherently coupling phase qubits have been described in Zagoskin, U.S. Pat. No. 6,563,311 referenced above, and U.S. patent application Ser. No. 09/872,495 (now U.S. Patent Application Publication 2002/0188578 A1), M. Amin, G. Rose, A. Zagoskin, and J. Hilton, "Quantum Processing System for a Superconducting Phase Qubit", filed Jun. 1, 2001, and the references therein, herein incorporated by reference in its entirety.

Figure 5B:
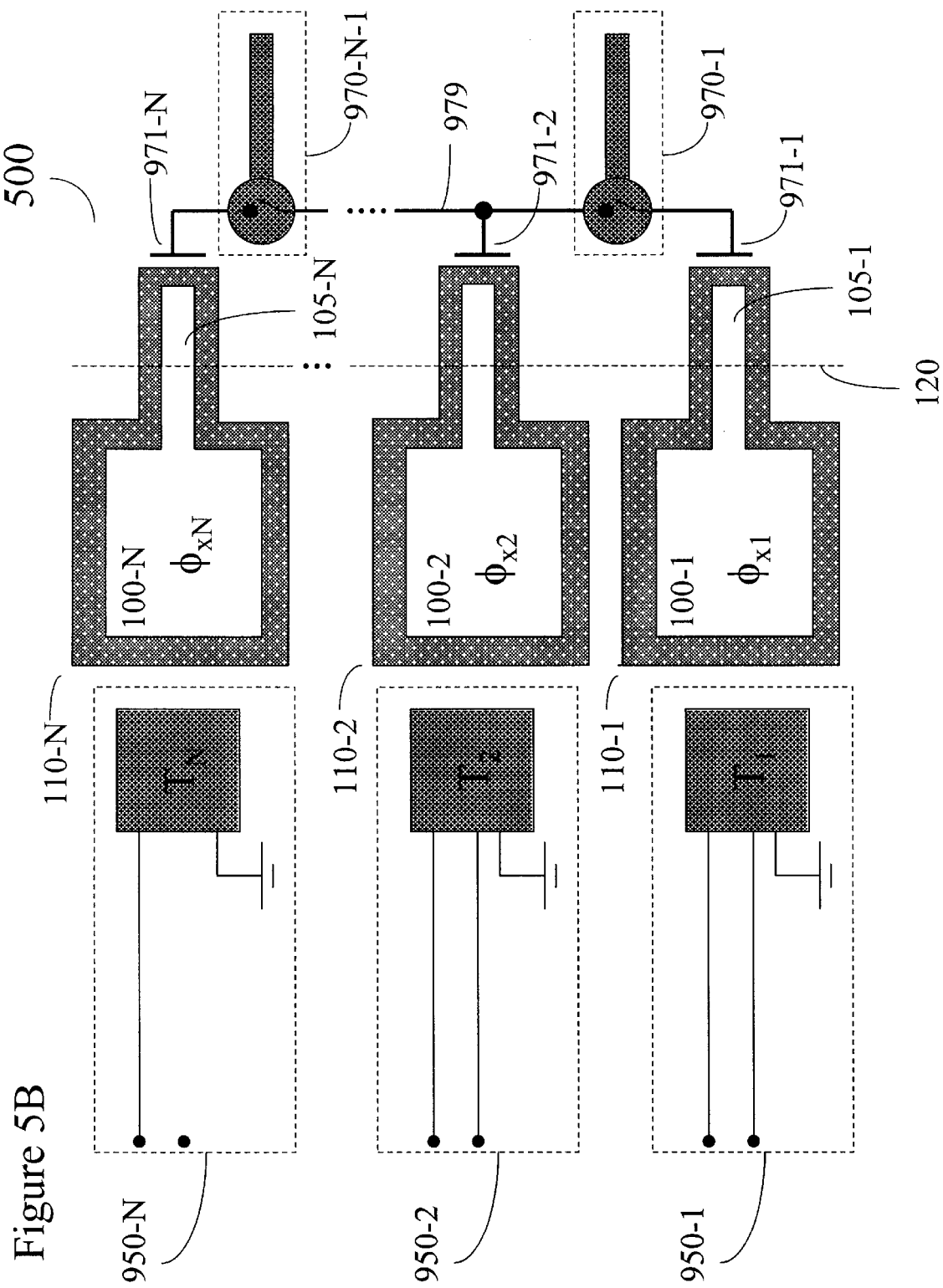

In one embodiment, the state of a first qubit can be entangled with the state of a second qubit by capacitively connecting the mesoscopic islands of the respective qubits. FIG. 5B illustrates an embodiment of a mechanism for coupling qubits. FIG. 5B includes capacitive couplings 971-1 through 971-N, connecting to mesoscopic islands 105-1 through 105-N respectively to bus 979. Entanglement of the states of adjacent qubits can be controlled by switches 970-1 through 970-N-1. For example, a method for entangling the states of qubits 100-1 and 100-2 includes closing switch 970-1 for a duration t. The duration t is characterized by the tunneling amplitude of the respective qubits involved in the operation. The capacitance C for the respective capacitive coupling 971-1 through 971-N can be less than the total capacitance of the Josephson junctions that separate the respective mesoscopic island 105 from the respective bulk region. In some embodiments, the capacitance is less than about $10^{-2}$ picoFarads/square micrometer ($pF/\mu m^2$).

Figure 6:
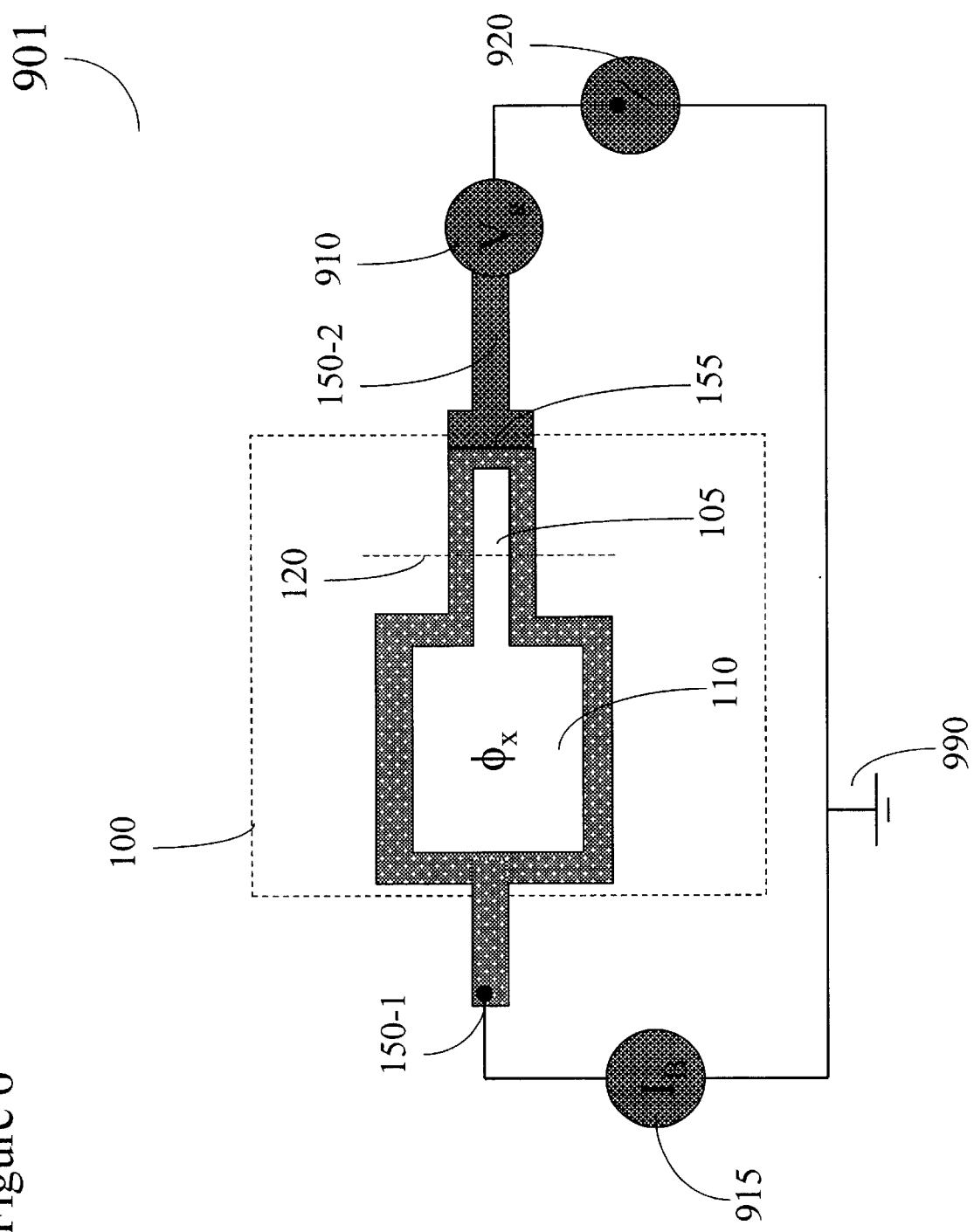
FIG. 6 illustrates a plan view of a qubit and another control system.

FIG. 6 shows a system where the qubit 100 includes leads through which a control system can control the information state of the qubit 100. The control system illustrated in FIG. 6 includes a mechanism for driving a bias current 915 between the bias leads 150-1 and 150-2, a mechanism for controlling the tunneling amplitude 910 of the mesoscopic island 105 and a switch 920 for decoupling the control system from the qubit 100. The control system illustrated in FIG. 6 facilitates quantum computing operations for initialization, readout, as well as bias operations and tunnel matrix operations. The lead 150-2 of the control system illustrated in FIG. 6 can be capacitively coupled to mesoscopic island 105, through the Josephson junction 155.

Fabrication of High-quality Josephson Junctions

In one embodiment, the two Josephson junctions (115-1 and 115-2 from FIG. 1) are sub-micron Josephson junctions.

A method for fabricating a qubit, where the qubit includes a loop of superconducting material having two relatively high-quality sub-micron Josephson junctions isolating a mesoscopic island, includes depositing a thin film of superconducting material, depositing an amorphous carbon (a-C) layer, etching the respective qubit pattern onto a chromium (Cr) mask, transferring the pattern to the a-C layer by patterning through the Cr mask, etching the pattern into the superconducting material, and removing the a-C layer from the superconducting layer. In some embodiments, each of the stages is applied using tools and methods known to persons of skill in the art. The superconducting material is an unconventional superconducting material such as, for example, YBCO and the like. Further examples of unconventional superconducting materials are described in detail above.

In one embodiment, the superconducting layer is deposited using standard pulsed laser deposition (PLD) techniques. Useful substrate materials typically have crystal lattices similar to that of the superconducting material. For YBCO, useful substrates are SrTiO or sapphire for example. In one embodiment, a thin layer of gold (Au) is deposited on the superconducting layer. The thickness of the Au layer is typically approximately 20 nm or less. Further, a second layer of Au can be deposited having a thickness of approximately 30 nm or less. The first Au layer can be deposited in situ and the second Au layer can be deposited ex situ. The first and second Au layers help prevent oxygen depletion in the superconducting layer. In one embodiment, the a-C layer is deposited using e-beam evaporation. The thickness of the a-C layer is approximately 120 nm or less. Patterning the qubit or chip layout onto the Cr mask can be performed independently from preparation of the qubit and can be accomplished using e-beam lithography and lift-off methods. Transfer of the Cr pattern to the a-C layer can be accomplished using oxygen plasma etching through the Cr mask, resulting in a positive a-C mask on the superconducting layer, which is then patterned in a final step. The final patterning step can be performed using Ar ion milling. The a-C mask can be removed from the superconducting layer after patterning by oxygen plasma etching. Furthermore, the Au layer can be removed by low acceleration Ar ion milling.

FIGS. 7A through 7D illustrate the 4 main stages of an embodiment of the fabrication process. First, a YBCO thin film 761 is deposited on a substrate 760 using standard PLD techniques and capped in-situ with a thin (~20 nm) layer of Au 761-1. A second thin Au film 761-2 having thickness of approximately 30 nm is deposited ex situ, forming a total Au film 761-1,2.

Figure 7A:
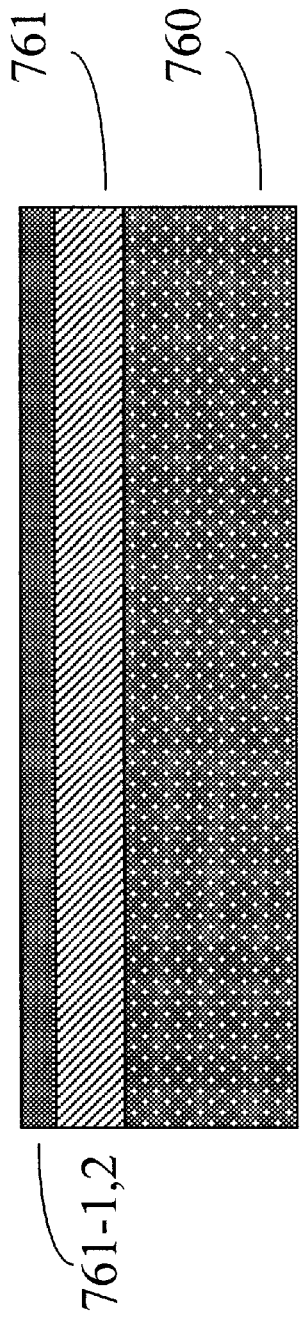
FIGS. 7A through 7D illustrate a fabrication process.
Figure 7B:
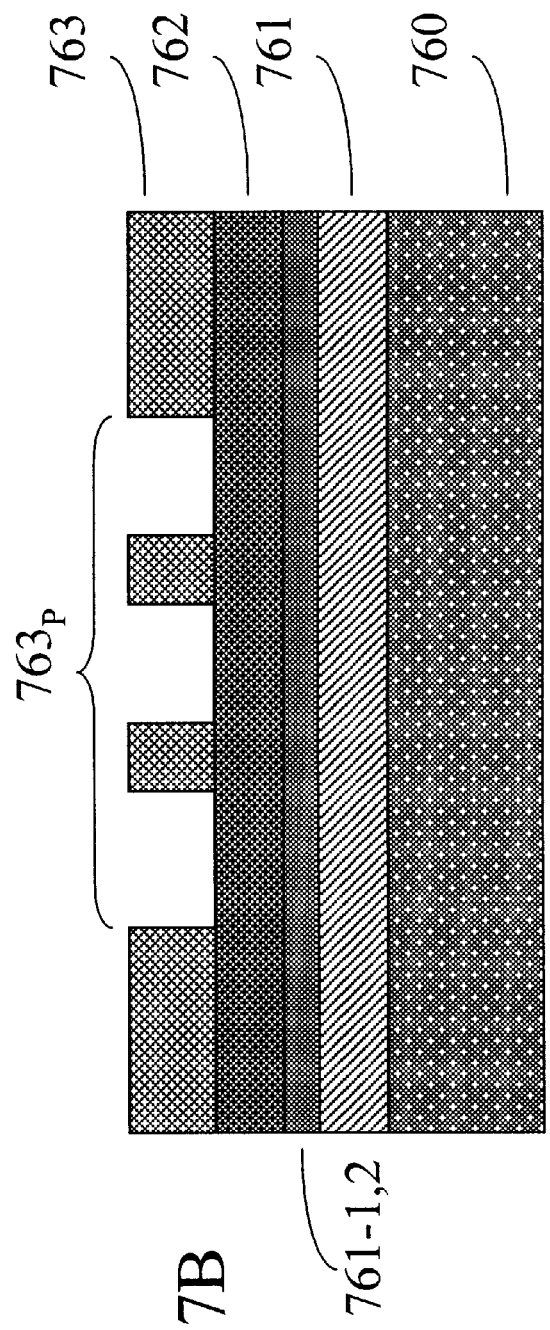
Figure 7C:
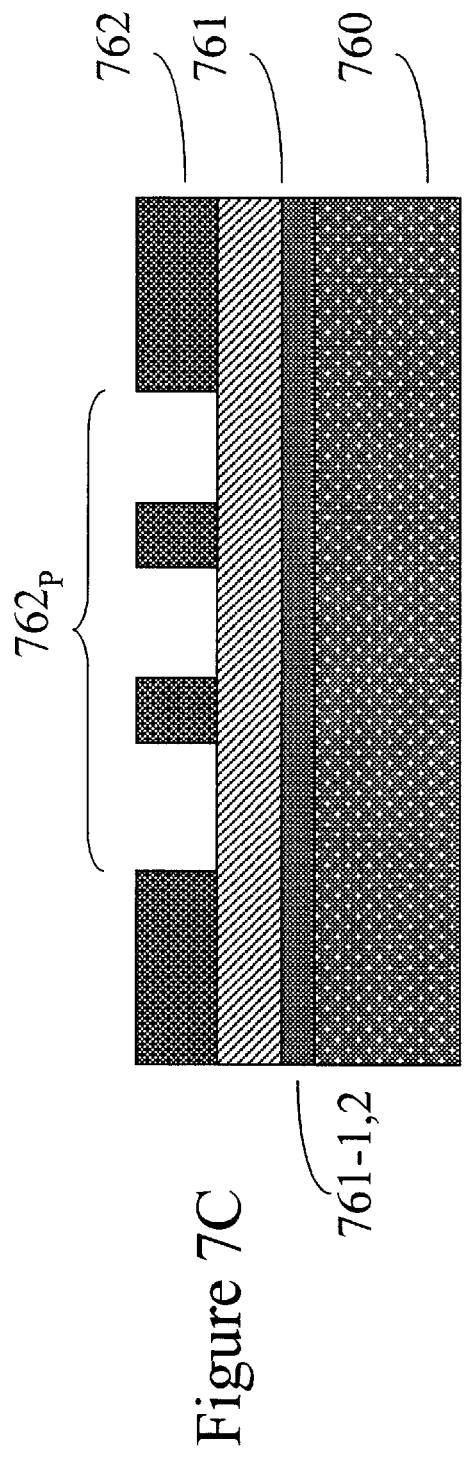
Figure 7D:
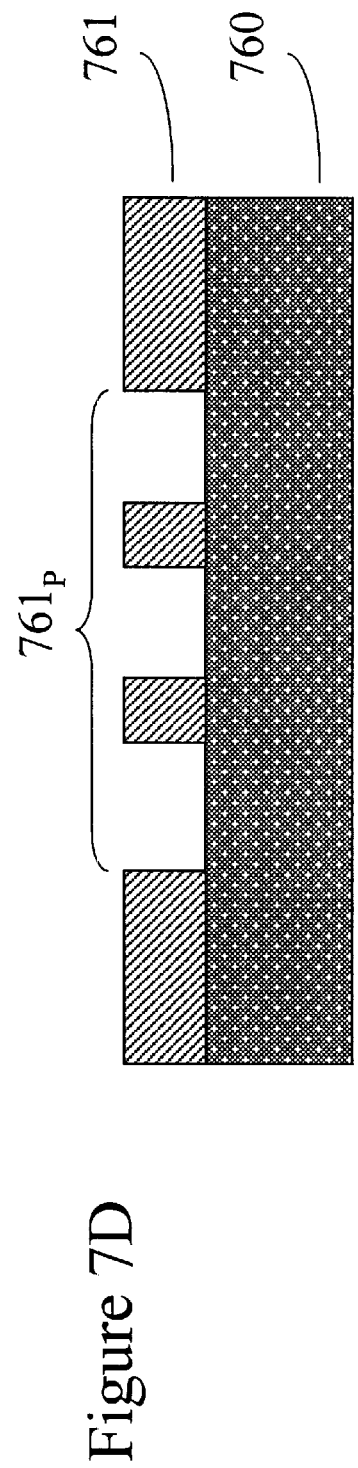

FIG. 7B illustrates patterning of the amorphous carbon mask. An a-C layer 762, having thickness of about 120 nm is deposited by e-beam evaporation. The chip design is patterned by e-beam lithography onto a Cr mask 763 using a lift-off technique. FIG. 7B illustrates patterned regions $763_P$ that form the desired structure. FIG. 7C illustrates transfer of the pattern 763$_P$ to the a-C mask 762 by oxygen plasma etching through the Cr mask 763 to form patterned region 762$_p$. This step renders a positive a-C mask of the chip on layer 761 which is then ready to be etched by Ar ion milling to form the operational device. FIG. 7D illustrates the final stage where the residual a-C mask has been stripped by oxygen plasma etching. Further, the thin Au layer 761-1,2 has been removed by low acceleration Ar ion milling.

The fabrication methods detailed above are used for fabricating high-quality submicron Josephson junctions formed out of unconventional superconducting materials. In one embodiment, the two sub-micron Josephson junctions are formed at grain boundaries in the superconducting layer (661 in FIG. 7). In one embodiment, the superconducting layer can be post-processed to enhance oxygenation of the Josephson junctions. Such post-processing can result in increased quality of Josephson junctions, reducing decoherence of the desired quantum information. Post-processing oxygen doping of Josephson junctions is described in detail in U.S. patent Ser. No. 60/316,378, "Oxygen Doping of Grain Boundary Josephson Junctions", filed Aug. 30, 2001, herein incorporated by reference in its entirety.

Alignment of the pattern with respect to the grain boundary can be accomplished by including fabrication steps for locating the grain boundary. A method for providing accurate alignment of the pattern with the grain boundary includes patterning fine ruler marks at the ends of the grain boundary. In one embodiment, the ruler marks have a pitch of about 0.5 $\mu$m or less. The ruler marks can be used with respect to the standard alignment marks to re-orient the pattern if necessary before processing begins.

Magnetically Isolated 2-Junction Qubit

In one embodiment, a two-junction phase qubit has a superconducting loop having a small aperture such that the effective inductance of the loop is approximately zero, a first Josephson junction and a second Josephson junction, separated by a mesoscopic island on one side and a bulk region on another side, wherein the superconducting material on at least one side of the first and second Josephson junctions has an order parameter having a non-zero angular momentum in its pairing symmetry, and a mechanism for interacting with the quantum state of the mesoscopic island. The mesoscopic island has a size such that its behavior is dominated by quantum mechanics. For example, the energy of the mesoscopic island is restricted to discrete energy levels.

In one embodiment, a mechanism for interacting with the quantum state of the mesoscopic island includes providing a third Josephson junction in the bulk region of the superconducting loop, with Josephson energy E$_J$ much larger than the first and second Josephson junctions. In such embodiments, the aperture of the superconducting loop can be extremely small such that its inductance is negligible. A small aperture will prevent magnetic fields from decohering the quantum state of the device. The third Josephson junction provides a mechanism for interacting directly with the quantum state of the qubit for performing the necessary quantum computing operations.

The phase across the third junction $\phi_3$ is related to the phase across the first and second Josephson junctions $\phi_1$ and $\phi_2$ respectively in the following way: $\phi=\phi_3=\phi_1+\phi_2$. In one embodiment, the third junction is larger than the first and second junctions such that the phase difference $\phi_3$ does not contribute to the quantum dynamical behavior of the qubit. For example, the third Josephson junction can have a width approximately 10 times larger than the width of either of the first or second Josephson junctions.

Figure 8:
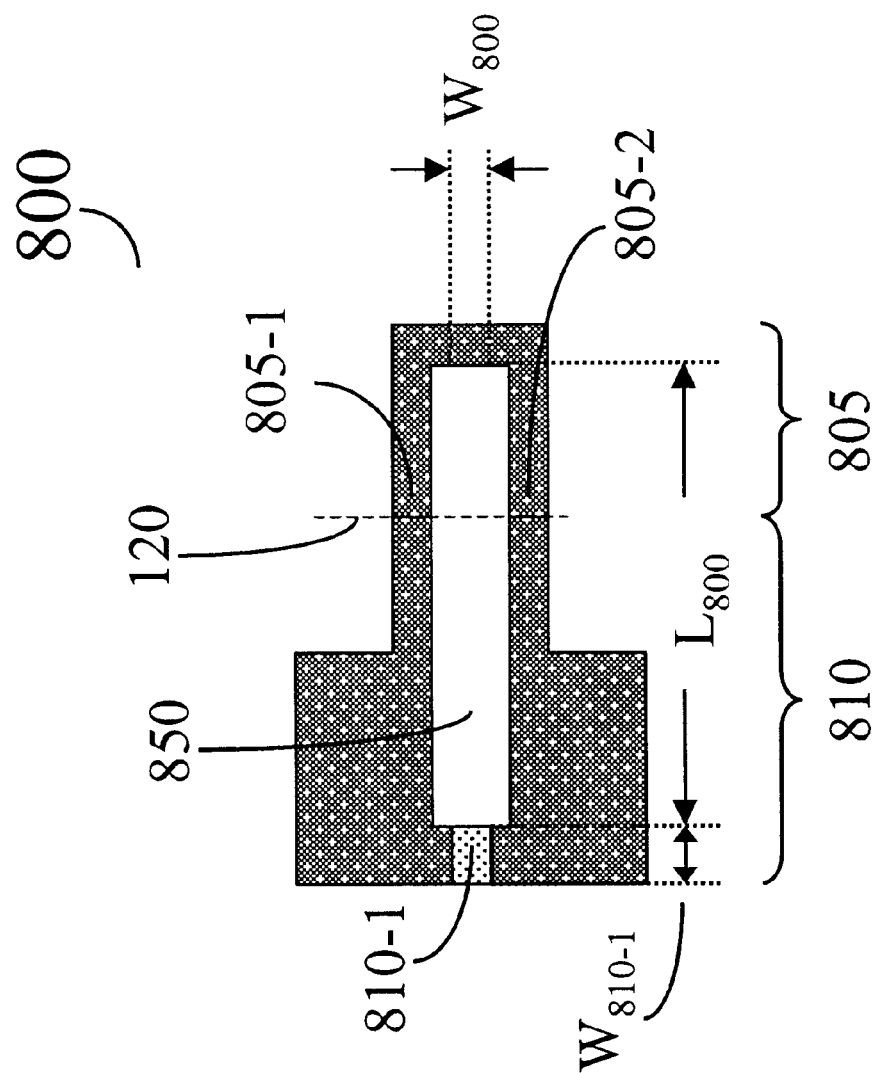
FIG. 8 illustrates a plan view of a three-junction phase qubit.

FIG. 8 illustrates a qubit 800 having two Josephson junctions 805-1 and 805-2 at a boundary 120 separating a mesoscopic island 805 and a bulk region 810. FIG. 8 further illustrates a mechanism for interacting with the quantum state 810-1. In some embodiments, superconducting loop 800 has an aperture 850 having a width W$_{800}$ of about 0.5–1 $\mu$m and length L$_{800}$ of about 2–5 $\mu$m. Aperture 850 can have a negligible inductance such that interaction of superconducting loop 800 with magnetic fields does not substantially interfere with the quantum state of mesoscopic island 805. In some embodiments, the inductance of aperture 850 is approximated as 0. Josephson junctions 805-1 and 805-2 can be grain boundary Josephson junctions. Widths useful for Josephson junctions 805-1 and 805-2 are described in detail above with respect to FIG. 1. Josephson junction 810-1 can have a width W$_{810-1}$ of about 1 $\mu$m to 20 $\mu$m. In one embodiment, Josephson junction W$_{810-1}$ is approximately 10 times larger than either of the first or second Josephson junctions.

The material forming at least a portion of the superconducting loop is a superconducting material with an order parameter having a pairing symmetry with non-zero angular momentum. Such superconducting materials are alternatively referred to as unconventional superconducting materials. Examples of superconducting materials useful for the present disclosure include materials selected from the family of cuprate superconductors; such as YBa$_2$Cu$_3$O$_{7-x}$, where x is between 0 and 0.6, Bi$_2$Sr$_2$Ca$_{n-1}$Cu$_n$O$_{2n+4}$, Tl$_2$Ba$_2$CuO$_{6+x}$, or HgBa$_2$CuO$_4$. Examples of low temperature unconventional superconducting materials include Sr$_2$RuO$_4$ or CeIrIn$_5$ and other similar materials.

The third Josephson junction can include a normal metal or a constriction. Methods for building such junctions are well known in the art. See, e.g., H. Hilgenkamp and J. Mannhart, "Grain Boundaries in high-T$_c$ Superconductors", Rev. Mod. Phys., 74, 485, and, C. Tsuei and J. Kirtley, "Pairing symmetry in cuprate superconductors", Rev. Mod. Phys., 72, 969 (October, 2000), and the references therein, herein incorporated in their entirety.

When the current across the third junction is 0, I$_3$≈0, such that the current in the overall loop is also 0, I$_0$≈0, the basis states of the qubit are degenerate and quantum tunneling will result. As described in detail above, quantum tunneling represents the quantum logical $\hat{\sigma}_x$ or bit-flip operation and describes coherent oscillations of the basis states of the qubit over time. In order to suppress quantum tunneling, the current in the loop should typically change such that I$_0$≠0. In the state where I$_0$≠0, a phase difference results across the third junction ($\phi_3$≠0), and the basis states of the qubit are no longer degenerate. The state where I$_0$≠0 will introduce an energy bias between the basis states of the qubit and this permits implementation of the $\hat{\sigma}_z$ or bias operation, as well as readout and initialization. It is known in the art that the single qubit operations $\hat{\sigma}_x$ and $\hat{\sigma}_z$ form a Universal set. See, e.g., U.S. patent application Ser. No. 09/782,886 (now U.S. Pat. Application Publication 2003/0164490 A1), to A. Blais, titled "Optimization Method for Quantum Computating Process", filed Feb. 13, 2000, herein incorporated by reference in its entirety. Thus, it is possible to implement a complete set of single qubit operations simply by controlling I$_0$ for each qubit.

A method for controlling the state of a qubit, wherein a qubit includes a loop of superconducting material and at least two Josephson junctions, such that the Josephson junctions isolate a mesoscopic island of the loop, includes a mechanism for controlling the current in the loop.

Furthermore, a mechanism for controlling current in the loop provides tunnel and phase operations, initialization, and readout for universal quantum computation.

A mechanism for controlling the state of a qubit further includes a current source, wherein the current source is capable of driving both alternating (AC) and direct (DC) currents. In one embodiment, the qubit includes a third Josephson junction and the current source is connected across the third Josephson junction such that the current source controls the current through the third Josephson junction. Furthermore, a mechanism for reading out the state of the qubit, wherein the qubit includes a third Josephson junction, includes providing a bias current source and a voltmeter, wherein the voltmeter is capable of measuring an alternating potential difference, and wherein the current source and voltmeter are connected across the third Josephson junction.

Figure 9:
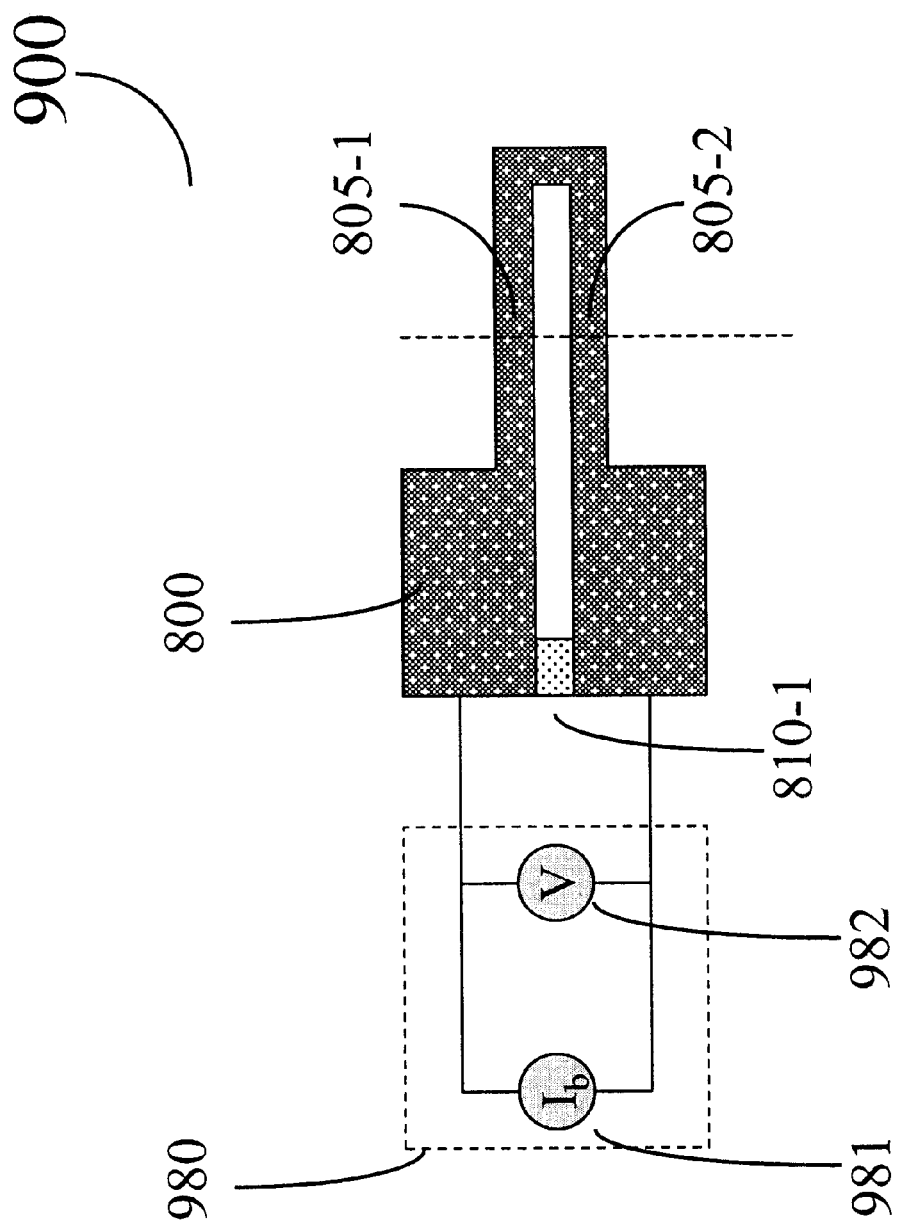
FIG. 9 illustrates a plan view of a three-junction qubit and control system.

FIG. 9 illustrates a system 900, wherein a control system 980 is used to interact and control the state of the qubit 800. The control system 980 includes a current source 981 and a voltmeter 982, and can be galvanically connected across the third Josephson junction. Current source 981 can drive a direct (DC) or alternating (AC) bias current $I_b$ through qubit 800. In some embodiments current source 982 drives both $I_b$(DC) and $I_b$(AC) simultaneously.

A method for initializing a 2-junction d-wave qubit includes providing a bias current in the loop $I_0 = \pm I_i$ for some duration t, such that the qubit enters one of its basis states. The direction of $I_0$ correlates with the respective ground state to be initialized. For example, a first ground state can correlate with $+I_0$, and a second ground state can correlate with $-I_0$. In one embodiment, the qubit includes a third Josephson junction, $I_0$ is greater than 0 and less than or equal to about $\pm I_{c3}$, where $I_{c3}$ is the critical current of the third Josephson junction.

A method for reading out the state of a 2-junction d-wave qubit, wherein the 2-junction d-wave qubit includes a third Josephson junction, includes providing a bias current in the loop $I = I_{DC} + I_{AC}$ for some duration t, and measuring a potential drop $V_R$ across the third junction. The potential drop $V_R$ will depend on the state of the qubit. In one embodiment, the DC component $I_{DC}$ of the bias current in the loop I can be less than $I_{C3}$, where $I_{C3}$ is the critical current of the third Josephson junction. In an embodiment, the amplitude of $I_{AC}$ can be greater than about 1 picoAmpere (pA) and less than about 1 nanoAmpere (nA). Further, the frequency of $I_{AC}$ is less than $\Delta$, the tunneling amplitude of the qubit. In one embodiment, the frequency of $I_{AC}$ ranges between about 5–50 MHz.

Figure 10:
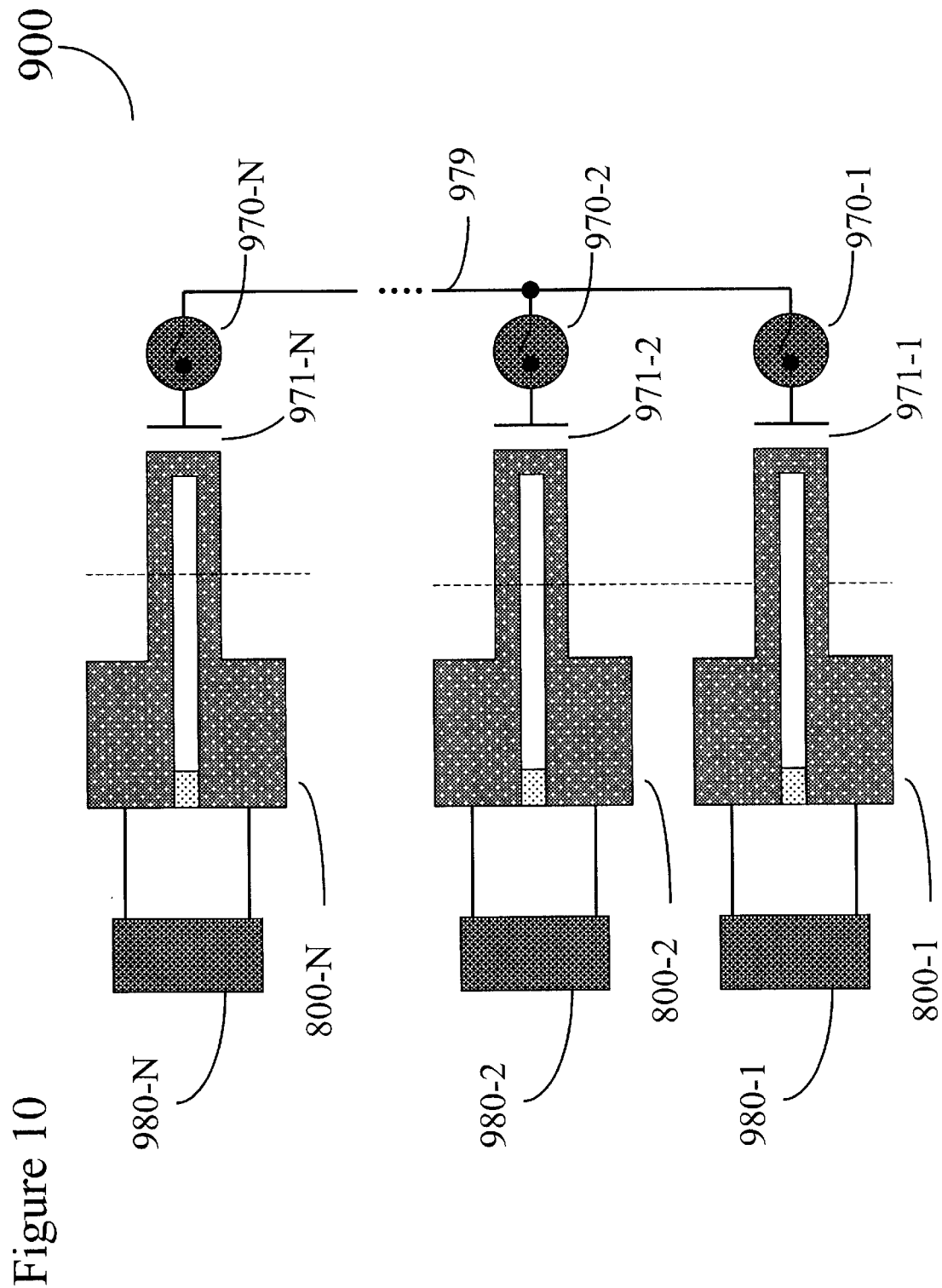
FIG. 10 illustrates a quantum register using three-junction phase qubits.

FIG. 10 illustrates a quantum register that includes a mechanism for controllably entangling the states of qubits. FIG. 10 illustrates quantum register 900 that includes qubits 800-1 through 800-N having control systems 980-1 through 980-N respectively. Further, FIG. 10 illustrates capacitive couplings 971-1 through 971-N having switches 970-1 through 970-N respectively, and a bus 979. A method for entangling the states of qubits in a quantum register includes selecting two qubits in the quantum register for a duration $t_C$. Selecting a qubit for entanglement can include closing the respective switch 970, such that when two switches are closed the states of the respective qubits are entangled through bus 979. For example, in order to entangle qubits 800-1 and 800-2 from FIG. 10, switches 970-1 and 970-2 are closed for a duration $t_C$. The duration $t_C$ depends on the qubits and can correlate with the inverse of the tunneling amplitude $\Delta^{-1}$ of the respective qubits. The capacitive entanglement apparatus can be conventional superconducting material such as niobium (Nb), aluminum (Al), or lead (Pb). Switches 970-1 through 970-N are typically SSETs. Relevant art for SSETs is incorporated by reference above.

In one embodiment, the bus 979 can be a resonant control system as described in detail in U.S. provisional serial No. 60/385,123, "Resonant Control System", filed Jul. 12, 2002, herein incorporated by reference in its entirety.

Figure 11:
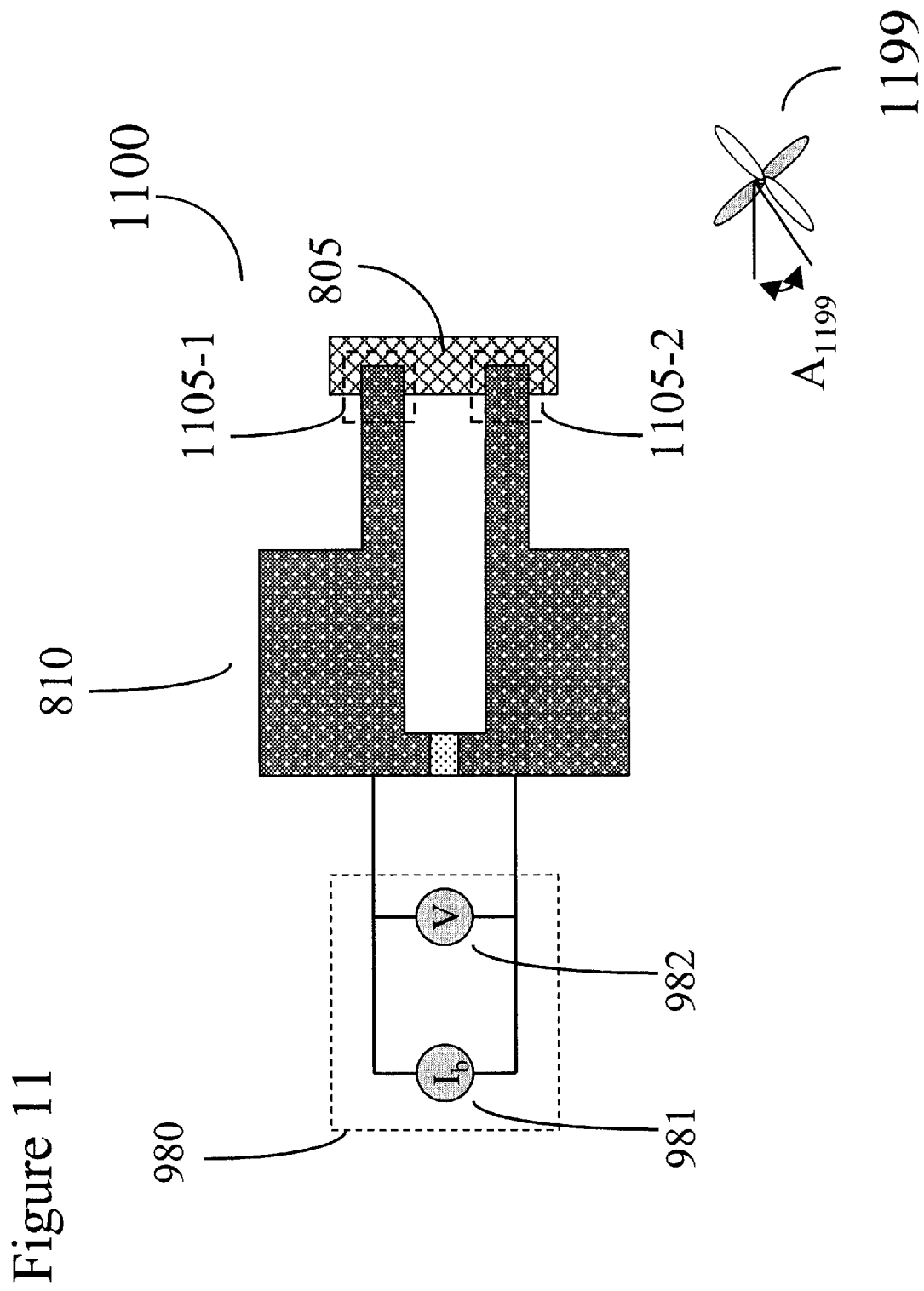
FIG. 11 illustrates a qubit with two heterostructure Josephson junctions separating a mesoscopic island and a bulk region.

FIG. 11 shows a Qubit 1100 that includes two Josephson junctions 1105-1 and 1105-2 separating a mesoscopic island 805 and a bulk region 810. The Josephson junctions 1105-1 and 1105-2 are heterostructure Josephson junctions, having unconventional superconducting material on a first side and different superconducting material on a second side. In one embodiment, the superconducting material forming region 805 is an unconventional superconducting material such as YBCO, and the superconducting material forming region 810 is a conventional material such as Nb, Al, or Pb. Methods for fabricating heterostructure junctions are described in detail in U.S. Pat. Ser. No. 10/006,787, "Trilayer Heterostructure Junctions", filed Dec. 6, 2001, herein incorporated by reference in its entirety.

Although the present invention has been described with reference to various embodiments, other embodiments will occur to those skilled in the art. It is to be understood that the embodiments described above have been presented by way of example, and not limitation, and that the invention is limited only by the appended claims.

What is claimed is:

1. A two-junction phase qubit, comprising:
   a superconducting loop, said superconducting loop comprising a bulk loop portion and a mesoscopic island portion; and
   two Josephson junctions in said superconducting loop, said Josephson junctions separating said bulk loop portion from said mesoscopic island portion.

2. The two-junction phase qubit of claim 1, wherein said mesoscopic island portion is relatively smaller than said bulk loop portion.

3. The two-junction phase qubit of claim 1, wherein said superconducting loop comprises a superconducting material with an order parameter that violates time reversal symmetry.

4. The two-junction phase qubit of claim 1, wherein said superconducting material comprises an unconventional superconducting material having a non-zero angular momentum in a pairing symmetry of its order parameter.

5. The two-junction phase qubit of claim 1, wherein at least one of said Josephson junctions comprises a grain-boundary Josephson junction.

6. The two-junction phase qubit of claim 1, wherein a width of said mesoscopic island portion ranges from about 0.1 $\mu$m or less to about 1 $\mu$m.

7. The two-junction phase qubit of claim 1, wherein a width of said mesoscopic island portion ranges from about 0.1 $\mu$m or less to about 1 $\mu$m and a length of said mesoscopic island portion ranges from about 0.3 $\mu$m or less to about 3 $\mu$m.

8. The two-junction phase qubit of claim 1, wherein a width of said bulk loop portion has an outer width in the range of about 1 $\mu$m to about 10 $\mu$m or more.

9. The two-junction phase qubit of claim 1, wherein at least one Josephson junction of said two Josephson junctions comprises an unconventional superconducting material on a first side of said at least one Josephson junction and a conventional superconducting material on a second side of said at least one Josephson junction.

10. The structure of claim 9, wherein said conventional superconducting material is selected from the group consisting of aluminum, niobium, and lead.

11. The structure of claim 9, wherein said unconventional superconducting material is selected from the group consisting of a d-wave superconducting material and a p-wave superconducting material.

12. The structure of claim 11, wherein said d-wave superconducting material is chosen from the group consisting of $YBa_2Cu_3O_{7-x}$, $Bi_2Sr_2Ca_{n-1}Cu_nO_{2n+4}$, $Tl_2Ba_2CuO_{6+x}$, and $HgBa_2CuO_4$, wherein x is less than 0.6 and greater than 0.

13. The two-junction phase qubit of claim 9, wherein said mesoscopic island comprises conventional superconducting material.

14. The two-junction phase qubit of claim 9, wherein said mesoscopic island comprises unconventional superconducting material.

15. A method for controlling an information state of a qubit having a superconducting loop comprising a bulk loop portion and a mesoscopic island portion and two Josephson junctions separating said bulk loop portion from said mesoscopic island portion, comprising:

applying a bias across said mesoscopic island portion.

16. The method of claim 15, wherein said applying a bias comprises driving a bias current in said superconducting loop.

17. The method of claim 15, wherein said applying a bias comprises driving a bias current in said superconducting loop by coupling a magnetic flux into the superconducting loop.

18. The method of claim 15, wherein said applying a bias comprises driving a bias current in said superconducting loop by inductively coupling to the superconducting loop.

19. The method of claim 15, further comprising inductively coupling to said bulk loop portion and capacitively coupling to said mesoscopic island portion.

20. The method of claim 15, further comprising capacitively coupling to said mesoscopic island portion.

21. A qubit apparatus comprising:

a superconducting loop, said superconducting loop comprising a bulk loop portion and a mesoscopic island portion;

two Josephson junctions in said superconducting loop, said Josephson junctions separating said bulk loop portion from said mesoscopic island portion;

a control system for applying a bias current across said mesoscopic island portion.

22. The qubit apparatus of claim 21, wherein said control system comprises a tank circuit inductively coupled to said superconducting loop.

23. The qubit apparatus of claim 21, wherein said control system comprises a dc-SQUID inductively coupled to said superconducting loop.

24. The qubit apparatus of claim 21, wherein said control system is weakly coupled to said superconducting loop permitting non-destructive measurements to be performed.

25. A qubit apparatus comprising:

a qubit comprising a superconducting loop having a bulk loop portion and a mesoscopic island portion and two Josephson junctions separating said bulk loop portion from said mesoscopic island portion; and means for controlling said qubit.

26. A phase qubit, comprising:

a loop of superconducting material, said loop having a bulk portion, a mesoscopic island portion;

a relatively small gap in said loop, said gap located in said bulk portion; and a first Josephson junction and a second Josephson junction separating said bulk portion from said mesoscopic island portion, wherein the superconducting material on at least one side of said first and second Josephson junctions has an order parameter having a non-zero angular momentum in its pairing symmetry.

27. The phase qubit of claim 26, wherein said mesoscopic island portion has a size such that at least one observable aspect of its behavior is dominated by quantum mechanics.

28. A phase qubit, comprising:

a superconducting loop, said superconducting loop comprising a bulk loop portion and a mesoscopic island portion; and first and second Josephson junctions in said superconducting loop, said Josephson junctions separating said bulk loop portion from said mesoscopic island portion.

a third Josephson junction in said bulk loop portion, said third Josephson junction having a Josephson energy relatively larger than a Josephson energy of said first and second Josephson junctions.

* * * * *